US007050318B1

(12) United States Patent
Argyres

(10) Patent No.: US 7,050,318 B1
(45) Date of Patent: May 23, 2006

(54) SELECTIVE MATCH LINE PRE-CHARGING IN A CAM DEVICE USING PRE-COMPARE OPERATIONS

(75) Inventor: Dimitri Argyres, San Jose, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/957,060

(22) Filed: Oct. 1, 2004

(51) Int. Cl.
*G11C 15/00* (2006.01)
*G11C 7/00* (2006.01)

(52) U.S. Cl. .................... 365/49; 365/189.07

(58) Field of Classification Search ............... 365/49, 365/189.07
See application file for complete search history.

(56) References Cited

U.S. PATENT DOCUMENTS

| 6,865,098 B1* | 3/2005 | Ichiriu et al. ............... 365/49 |
| 6,903,953 B1* | 6/2005 | Khanna .................... 365/49 |
| 6,906,937 B1* | 6/2005 | Nataraj .................... 365/49 |
| 6,910,097 B1* | 6/2005 | Srinivasan et al. .......... 365/49 |
| 6,934,796 B1* | 8/2005 | Pereira et al. ............. 365/49 |

* cited by examiner

*Primary Examiner*—Trong Phan
(74) *Attorney, Agent, or Firm*—William L Paradice, III

(57) ABSTRACT

A CAM device for comparing a search key with a plurality of CAM words stored in a main CAM array includes a pre-compare CAM array and match line control logic. The pre-compare CAM array includes a plurality of rows, each for storing a set of pre-compare bits generated by performing a logical function on a corresponding CAM word. The match line control logic selectively pre-charges match lines in the main CAM array in response to match results from a pre-compare operation between an encoded search key and corresponding sets of pre-compare bits.

72 Claims, 20 Drawing Sheets

SELECTIVE MATCH LINE PRE-CHARGING IN A CAM DEVICE USING PRE-COMPARE OPERATIONS

FIELD OF INVENTION

This invention relates generally to semiconductor memories and specifically to reducing power consumption in content addressable memories.

DESCRIPTION OF RELATED ART

Content addressable memory (CAM) devices are frequently used in network switching and routing applications to determine forwarding destinations for data packets. A CAM device can be instructed to compare a selected portion of an incoming packet (e.g., a destination address extracted from the packet header) with CAM words (e.g., forwarding address) stored in an array within the CAM device. If there is a matching entry stored in the CAM array, the index of the matching CAM word can be used to access a corresponding location in an associated memory device to retrieve a destination address and/or other routing information for the packet.

A CAM device includes a CAM array having a number of rows of CAM cells, each for storing a CAM word. During a compare operation, a search key (e.g., a comparand word) is provided to the CAM array and compared with the CAM words stored therein. For each CAM word that matches the search key, a corresponding match line is asserted to indicate the match result. If any of the match lines are asserted, a match flag is asserted to indicate the match condition, and a priority encoder determines the match address or index of the highest priority matching entry in the CAM array.

Typically, the match lines of the CAM array are pre-charged toward a supply voltage (e.g., to logic high) prior to the compare operation. During the compare operation, if the CAM word stored in a row matches the search key, the row's match line remains in its charged state to indicate a match condition for the row. Conversely, if the CAM word stored in a row does not match the search key, the row's match line is discharged toward ground potential (e.g., to logic low) by the one or more mismatching CAM cells to indicate a mismatch condition for the row. The discharged match lines are then pre-charged to the supply voltage for the next compare operation.

Alternately charging and discharging the match lines in a CAM array for compare operations may result in significant power consumption. This power consumption increases as the size and/or density of the CAM array increases and, therefore, undesirably limits the memory size and the scalability of the CAM array. Thus, it would be desirable to reduce the power consumption associated with pre-charging the match lines of a CAM array for compare operations.

BRIEF DESCRIPTION OF THE DRAWINGS

Like reference numerals refer to corresponding parts throughout the drawing figures.

DETAILED DESCRIPTION

Figure 1:
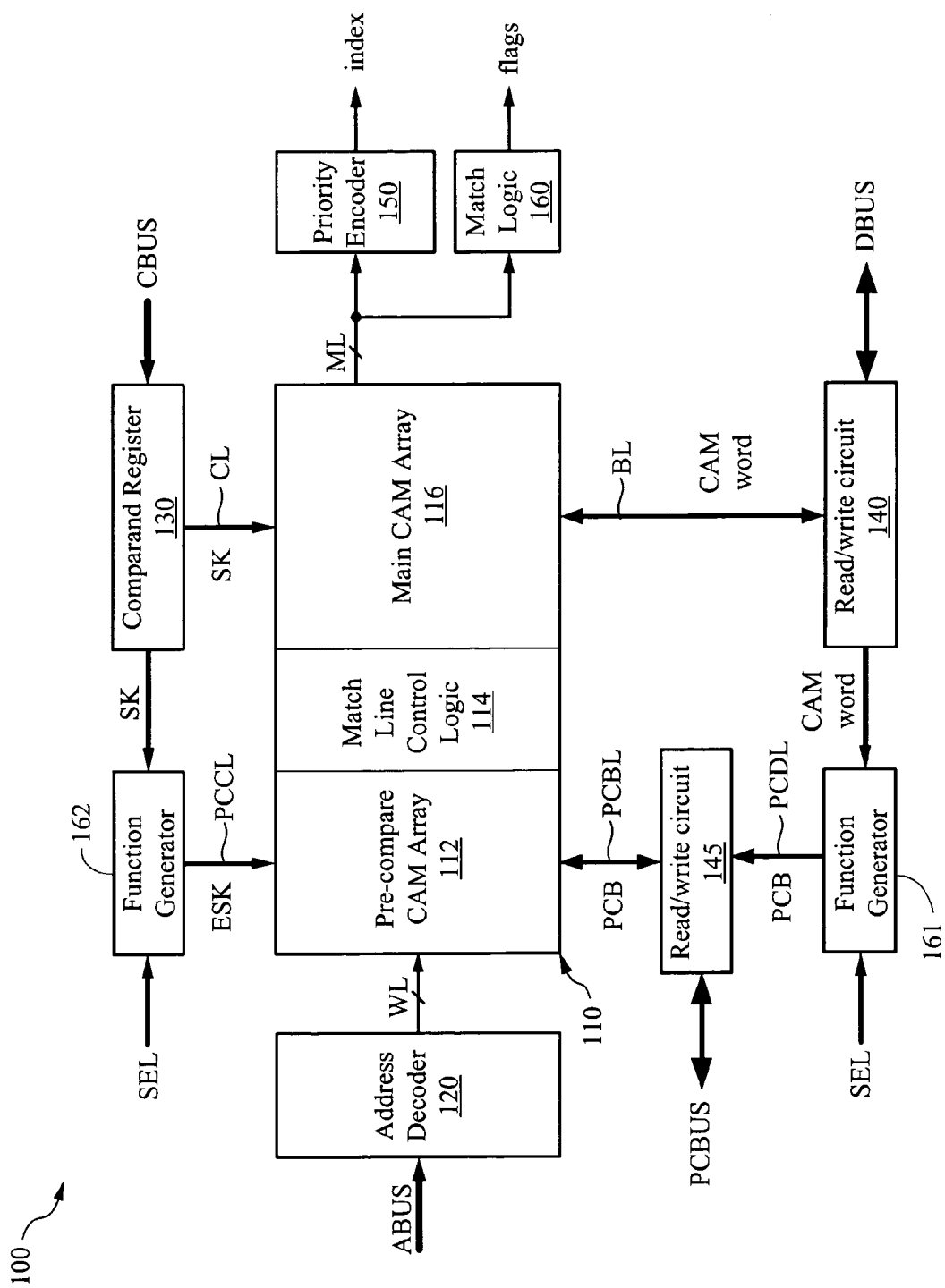
FIG. 1 is a block diagram of one embodiment of a CAM device in accordance with the present invention.

A method and apparatus for reducing power consumption in a CAM device is disclosed. It is to be understood that embodiments of the present invention are equally applicable to other memory structures such as, for example, RAM, EPROM, EEPROM, and flash memory devices, as well as other memory architectures including, for example, translation look-aside buffers (TLBs) and look-up tables (LUTs). In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present invention is not to be construed as limited to specific examples described herein but rather includes within its scope all embodiments defined by the appended claims.

Embodiments of the present invention reduce the power consumption of CAM devices during compare operations between a search key and CAM words stored in a main CAM array by selectively enabling the match lines in the main CAM array in response to a pre-compare operation between an encoded search key and sets of pre-compare bits corresponding to the CAM words stored in the main CAM array. For some embodiments, each set of pre-compare bits is generated by performing a predetermined logical function on a corresponding CAM word, and the encoded search key is generated by performing the same predetermined logical function on the search key. For present embodiments, the predetermined logical function may be any suitable logical function other than a unity function such that the sets of pre-compare bits are not subsets of corresponding CAM words and the encoded search key is not a subset of the search key. For some embodiments, the pre-compare bits are well-known parity bits. For one embodiment, the pre-compare bits may be generated using well-known error checking circuitry that performs a checksum operation on the CAM words to generate one or more parity bits. For such an embodiment, the error checking circuitry may also be used to generate the encoded search key from the search key.

For each set of pre-compare bits that matches the encoded search key, the corresponding match line in the main CAM array is pre-charged (e.g., to logic high) to enable detection of match results thereon. Conversely, for each set of pre-compare bits that mismatches the encoded search key, the corresponding match line in the main CAM array is not pre-charged, thereby reducing power consumption associated with match line pre-charging. For some embodiments, for each mismatch condition in the pre-compare operation, a corresponding match line in the main CAM array is discharged (e.g., to logic low), thereby forcing the match line to a mismatch condition.

FIG. 1 shows one embodiment of a CAM device 100 in accordance with the present invention. CAM device 100 is shown to include an array 110, an address decoder 120, a comparand register 130, read/write circuits 140 and 145, a priority encoder 150, and match logic 160. CAM device 100 is also coupled to a first function generator 161 and to a second function generator 162. CAM array 110 includes a pre-compare CAM array 112, match line control logic 114, and a main CAM array 116. One or more instructions and related control signals can be provided to CAM device 100 from an instruction decoder (not shown for simplicity) to control read, write, compare, initialization, and other operations for CAM device 100. Other well-known signals that can be provided to CAM device 100, such as enable signals, clock signals, and power connections, are not shown for simplicity.

Main CAM array 116 includes a plurality of rows, each including any number of CAM cells (not shown in FIG. 1 for simplicity) for storing a corresponding CAM word. Each row of CAM cells in main array 116 is coupled to address decoder 120 via a corresponding word line WL, and is also coupled to match line control logic 114, to priority encoder 150, and to match logic 160 via a corresponding main match line ML. For simplicity, the word lines WL and main match lines ML are represented collectively in FIG. 1. Further, although not shown in FIG. 1, each row of CAM cells in main CAM array 116 can include one or more validity bits to indicate whether the corresponding row (or any segment thereof) of CAM cells stores valid data. In addition, for some embodiments, CAM device 100 includes a well-known match latch circuit (not shown for simplicity) coupled between the main match lines ML and priority encoder 150 to latch match results generated in main CAM array 116.

For some embodiments, the rows in main CAM array 116 may be divided into a plurality of row segments, for example, to reduce the capacitive loading for each row and/or to provide multiple width/depth configurations for the array. For one embodiment, the segmented rows of main CAM array 116 may be programmed to operate in various width and depth configurations to accommodate CAM words of varying lengths as described, for example, in U.S. Pat. No. 6,243,281 to Pereira, which is assigned to the assignee of the present invention and incorporated herein by reference.

Each column of CAM cells in main CAM array 116 is coupled to comparand register 130 via one or more corresponding comparand lines CL, and is coupled to read/write circuit 140 via one or more corresponding bit lines BL. For simplicity, the comparand lines CL and bit lines BL are represented collectively in FIG. 1. Comparand register 130 is well-known, and is configured to provide a search key (SK) (e.g., a comparand word) received from a comparand bus CBUS to main CAM array 116 during compare operations with CAM words stored therein. For other embodiments, the search key can be provided to main CAM array 116 via another bus and/or circuit. Read/write circuit 140 includes well-known write drivers to write CAM words received from a data bus DBUS to main CAM array 116, and includes well-known sense amplifiers to read CAM words from main CAM array 116 onto DBUS. For other embodiments, read/write circuit 140 may be coupled to a bus other than DBUS.

Pre-compare CAM array 112 includes a plurality of rows, each including one or more CAM cells (not shown in FIG. 1 for simplicity) for storing a set of one or more pre-compare bits (PCB) for a corresponding CAM word stored in main CAM array 116. Each row of CAM cells in pre-compare CAM array 112 is coupled to address decoder 120 via a corresponding word line WL, and to match line control logic 114 via a corresponding pre-compare match line (pre-compare match lines not shown in FIG. 1 for simplicity). For some embodiments, corresponding rows in pre-compare CAM array 112 and main CAM array 116 may share the same word line. For other embodiments, corresponding rows in pre-compare CAM array 112 and main CAM array 116 may be coupled to address decoder 120 via separate word lines.

Each column of CAM cells in pre-compare CAM array 112 is coupled via one or more corresponding pre-compare bit lines PCBL to read/write circuit 145, which in turn is coupled to first function generator 161 via corresponding pre-compare data lines PCDL. Read/write circuit 145 includes well-known write drivers to write the pre-compare bits received either from first function generator 161 via lines PCDL or from a pre-compare bus PCBUS to pre-compare CAM array 112, and includes well-known sense amplifiers to read sets of pre-compare bits from pre-compare array 112 onto PCBUS. For other embodiments, read/write circuit 145 may be coupled to a bus other than PCBUS. For one embodiment, PCBUS may be eliminated. For another embodiment, read/write circuit 145 may be incorporated within first function generator 161.

Each column of CAM cells in pre-compare array 112 is also coupled to second function generator 162 via one or more corresponding pre-compare comparand lines PCCL. For simplicity, the pre-compare comparand lines PCCL, the pre-compare bit lines PCBL, and the pre-compare data lines PCDL are represented collectively in FIG. 1. Further, although not shown in FIG. 1 for simplicity, some embodiments of CAM array 110 may also include pre-compare match line control logic configured to selectively pre-charge the pre-compare match lines (e.g., to a logic high state) for pre-compare operations in pre-compare CAM array 112. For other embodiments, pre-compare CAM array 112 may be separate from CAM array 110.

First function generator 161 includes a first input to receive from read/write circuit 140 a CAM word that is to be written into main CAM array 116, a second input to receive a function select signal SEL, and one or more outputs coupled to corresponding columns of pre-compare CAM array 112 via read/write circuit 145. Alternately, first function generator 161 may receive the CAM word directly from DBUS. In response to SEL, which may be provided as part of an instruction to CAM device 100 (e.g., either through a dedicated input pin of CAM device 100 or by any other suitable bus or circuit), first function generator 161 performs one of a plurality of predetermined logical functions on the CAM word to generate a corresponding set of pre-compare bits (PCB). For other embodiments, SEL may be omitted, and first function generator 161 may be configured to generate the set of pre-compare bits from the CAM word using a designated logic function. First function generator 161 is preferably formed using conventional combinatorial circuitry to generate the pre-compare bits shortly after a corresponding CAM word is loaded into read/write circuit 140, although other well-known logic circuits may be used such as, for example, sequential logic, a memory element (e.g., a LUT), or programmable logic. The sets of pre-compare bits are not subset of corresponding CAM words, and the number of pre-compare bits is preferably much less than the number of bits in the corresponding CAM word, and is not a subset of the CAM word.

Second function generator 162 includes a first input to receive the search key SK from comparand register 130, a second input to receive SEL, and one or more outputs coupled to corresponding columns of pre-compare CAM array 112 via PCCL. Alternately, second function generator 162 may receive the search key directly from CBUS. In response to SEL, second function generator 162 performs one of the plurality of predetermined logical functions on the search key to generate an encoded search key (ESK). For other embodiments, SEL may be omitted, and second function generator 162 may be configured to generate the encoded search key from the search key using the designated logic function. Second function generator 162 is preferably formed using conventional combinatorial circuitry to generate the encoded search key shortly after the search key is loaded into comparand register 130, although other well-known logic circuits may be used such as, for example, sequential logic, a memory element (e.g., a LUT), or programmable logic. The encoded search key is not subset of the search key, and the number of encoded search key bits is preferably much less than the number of search key bits.

As described in more detail below, the encoded search key may be compared with the sets of pre-compare bits stored in pre-compare CAM array 112 to generate pre-compare match results that may be used to selectively pre-charge corresponding match lines ML in main CAM array 116. For each row in main CAM array 116 that is not pre-charged for a compare operation with the search key, power consumption of CAM device 100 is reduced.

During write and subsequent compare operations in CAM device 100, function generators 161 and 162 should use the same logical function to generate the sets of pre-compare bits and the encoded search key, respectively. For embodiments in which function generators 161 and 162 are configured to select one of a plurality of predetermined logical functions in response to SEL, the same value of SEL should be provided to function generators 161 and 162. The predetermined logical functions performed by function generators 161 and 162 may be any suitable logical function including, for example, a logic AND function, a logic OR function, a logic exclusive-OR (XOR) function, a data compression function, an encryption function, or some other suitable non-unity logical function. For some embodiments, function generators 161 and 162 may be the same circuit. For example, for one embodiment, function generators 161 and 162 may be replaced by a single function generator having an input multiplexed between receiving a CAM word or a search key, and having outputs multiplexed between PCDL and PCCL. For other embodiments, function generators 161 and 162 may be external to CAM device 100, for example, and provided within a host processor (not shown for simplicity) connected to CAM device 100.

For some embodiments, the pre-compare bits may be well-known parity bits generated from corresponding CAM words, for example, using any suitable parity check (e.g., checksum) technique. As known in the art, parity bits are generally used to ensure the integrity of CAM words stored in the array. For such embodiments, the parity bits may be provided to pre-compare CAM array 112 from a well-known error checking circuit (not shown in FIG. 1) via read/write circuit 145. In addition, for such embodiments, the error checking circuit may be used to generate the encoded search key in response to the search key. In this manner, the pre-compare bits and the encoded search key may be generated using existing error-checking resources of the CAM device, thereby allowing function generators 161 and 162 to be omitted to conserve power and circuit area. For one embodiment, the parity bits (e.g., thus the pre-compare bits) may be generated and continually used to check the integrity of CAM words stored in main CAM array 116 in the manner described in U.S. Pat. No. 6,597,595 to Ichiriu et al, which is assigned to the assignee of the present invention and is incorporated herein by reference.

Match line control logic 114 includes a plurality of inputs coupled to corresponding pre-compare match lines in pre-compare CAM array 112, and includes a plurality of outputs coupled to corresponding main match lines in main CAM array 116. Match line control logic 114 is configured to selectively pre-charge the main match lines in main CAM array 116 in response to pre-compare match results generated on corresponding pre-compare match lines in pre-compare CAM array 112 during pre-compare operations between the encoded search key and the sets of pre-compare bits stored in pre-compare CAM array 112. Further, although not shown in FIG. 1 for simplicity, for some embodiments, match line control logic 114 may include a clock input to receive a pre-charge signal. For one embodiment, assertion of the pre-charge signal enables match line control logic 114 to selectively pre-charge the main match lines in response to match conditions in pre-compare CAM array 112, and de-assertion of the pre-charge signal prevents match line control logic 114 from pre-charging the main match lines, irrespective of match conditions in pre-compare CAM array 112.

Address decoder 120 is well-known, and includes circuitry to select corresponding rows in pre-compare CAM array 112 and main CAM array 116 for read, write, and/or other operations in response to an address received from an address bus ABUS. For other embodiments, addresses may be provided to address decoder 120 from another suitable bus and/or circuitry.

The main match lines ML provide match results for compare operations between a search key and CAM words stored in main CAM array 116 to priority encoder 150 and to match logic 160. In response thereto, priority encoder 150 determines the matching entry that has the highest priority number associated with it and generates the index or address of this highest priority match (HPM) in a well-known manner. In addition, priority encoder 150 can use the validity bits (not shown in FIG. 1) from main CAM array 116 to generate the next free address (NFA) that is available in main CAM array 116 and/or pre-compare CAM array 112 for storing new data. For some embodiments, priority encoder 150 provides the NFA as an input address to address decoder 120.

Match logic 160, which is well-known, uses the match results indicated on ML to generate a match flag indicative of a match condition in main CAM array 116. If there is more than one matching entry in main CAM array 116, match logic 160 may generate a multiple match flag to indicate a multiple match condition. In addition, match logic 160 may use the validity bits from main CAM array 116 to assert a full flag when all of the rows of CAM cells in main CAM array 116 are filled with valid entries.

Figures 2A, 2B:
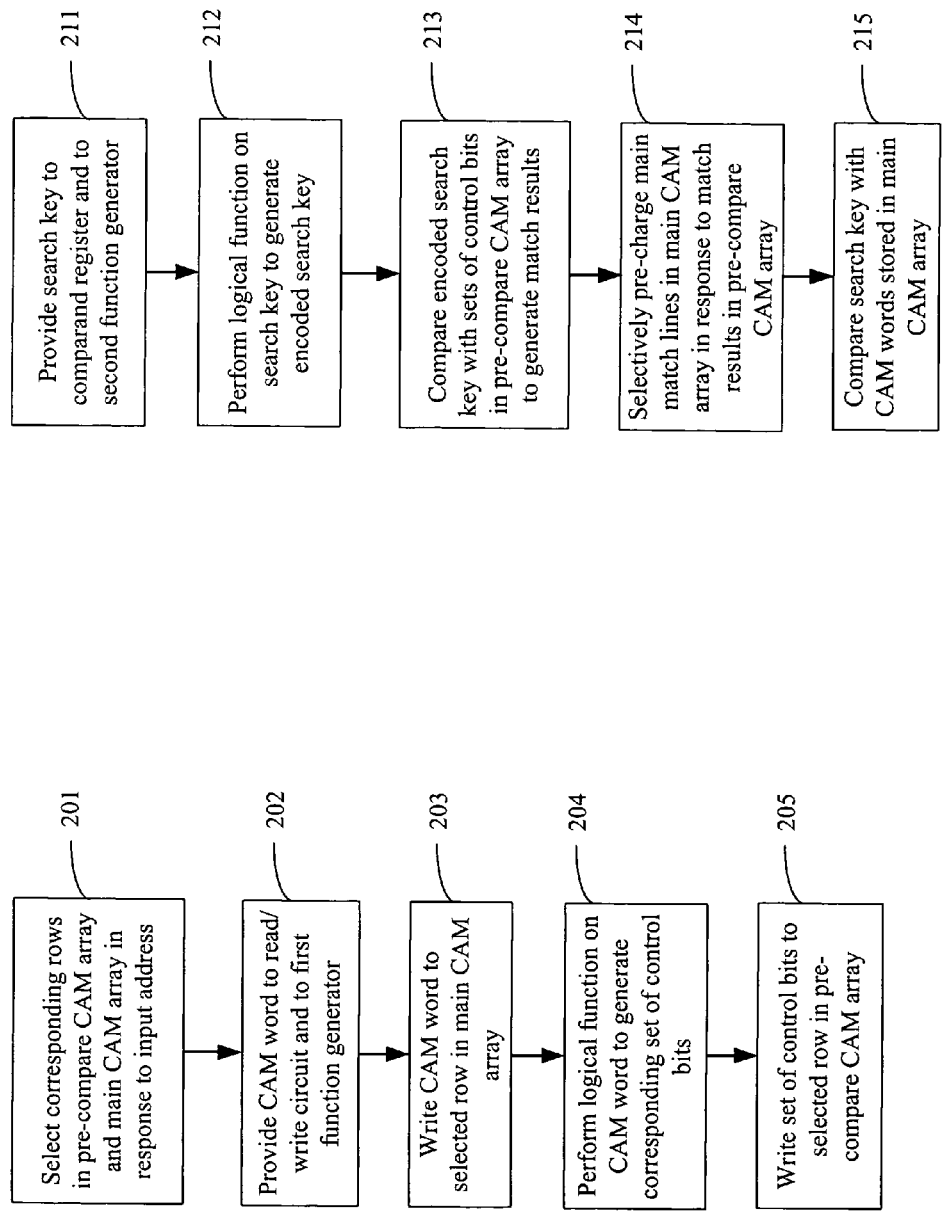
FIG. 2A is a flow chart illustrating an exemplary write operation for one embodiment of the CAM device of FIG. 1.
FIG. 2B is a flow chart illustrating an exemplary compare operation for one embodiment of the CAM device of FIG. 1.

An exemplary operation of writing a CAM word to main CAM array 116 and writing a corresponding set of pre-compare bits to pre-compare CAM array 112 is described below with reference to the illustrative flow chart of FIG. 2A. First, an input address is provided to address decoder 120, which in response thereto asserts a word line WL to select a corresponding row in pre-compare CAM array 112 and in main CAM array 116 (201). The input address may be an externally provided address, the NFA generated by priority encoder 150, or any other presented address. A CAM word is then provided to read/write circuit 140 and to first function generator 161 (202). Read/write circuit 140 drives the CAM word onto bit lines BL to write the CAM word to the selected row in main CAM array 116 (203). First function generator 161 performs a predetermined logic function on the CAM word to generate a corresponding set of pre-compare bits (204). For some embodiments, first function generator 161 selects one of a plurality of predetermined logical functions in response to SEL, and generates the corresponding set of pre-compare bits as the selected logical function of the CAM word. The set of pre-compare bits is then provided via pre-compare data lines PCDL to read/write circuit 145, which in turn writes the pre-compare bit set to the selected row in pre-compare CAM array 112 via pre-compare bit lines PCBL (205).

An exemplary compare operation for CAM device 100 is described below with reference to the illustrative flow chart of FIG. 2B. First, a search key is provided to comparand register 130 and to second function generator 162 (211). Second function generator 162 generates the encoded search key by performing the same logical function used by first function generator 161 on the search key (212). For some embodiments, second function generator 162 selects one of the plurality of predetermined logical functions in response to SEL, and generates the encoded search key as the selected logical function of the search key. Then, the pre-compare match lines in pre-compare CAM array 112 are pre-charged (e.g., to logic high). The encoded search key is driven onto pre-compare comparand lines PCCL and compared with sets of pre-compare bits stored in pre-compare CAM array 112 to generate pre-compare match results on the pre-compare match lines (213). In response thereto, match line control logic 114 selectively enables corresponding main match lines in main CAM array 116 for the compare operation between the search key and the CAM words stored in main CAM array 116 (214). Then, the search key is driven onto comparand lines CL via comparand register 130 and compared with CAM words stored in main CAM array 116 to generate match results on main match lines ML (215).

For some embodiments, match line control logic 114 pre-charges (e.g., to logic high) a match line in main CAM array 116 if the corresponding row in pre-compare CAM array 112 indicates a match condition, and does not pre-charge the match line in main CAM array 116 if the corresponding row in pre-compare CAM array 112 indicates a mismatch condition. For one embodiment, match line control logic 114 discharges a match line in main CAM array 116 (e.g., to logic low) if the corresponding row in pre-compare CAM array 112 indicates a mismatch condition, thereby forcing the main match line to a mismatch state to prevent the CAM word stored in the corresponding row of main CAM array 116 from participating in the compare operation with the search key. In this manner, mismatch conditions in pre-compare CAM array 112 may be used to disable corresponding rows in main CAM array 116 for compare operations with the search key.

By selectively pre-charging the match lines ML in main CAM array 116 in response to pre-compare results in pre-compare CAM array 112, power consumption associated with pre-charging the match lines in main CAM array 116 may be reduced. For example, for each match line in main CAM array 116 that is disabled (e.g., not pre-charged) in response to mismatch conditions in pre-compare array 112, power consumption associated with pre-charging the corresponding match line in main CAM array 116 is reduced. The reduction in power consumption associated with pre-charging the match lines in main CAM array 116 may be increased by increasing the percentage of mismatch conditions in pre-compare CAM array 112. Accordingly, it is desirable to maximize the percentage of rows in pre-compare CAM array 112 that indicate a mismatch condition during pre-compare operations with the encoded search key.

Because the likelihood that the encoded search key matches any of the sets of pre-compare bits in pre-compare CAM array 112 decreases as the number of individual bit comparisons between the encoded search key and the pre-compare bits increases, the percentage of mismatch conditions in pre-compare CAM array 112 may be increased by increasing the number of pre-compare bits and the number of encoded search key bits that are compared with each other during pre-compare operations. For some embodiments, the probability of a row in pre-compare CAM array 112 having a mismatch condition is exponentially related to the number of pre-compare bits that are compared with corresponding encoded search key bits. For example, if a single pre-compare bit is compared with a 1-bit encoded search key, there is a ½=50% chance of a match condition and thus a 50% chance of a mismatch condition. If two pre-compare bits are compared with a 2-bit encoded search key, there is a (½)*(½)=25% chance of a match condition and thus a 75% chance of a mismatch condition. If three pre-compare bits are compared with a 3-bit encoded search key, there is a $(\frac{1}{2})*(\frac{1}{2})*(\frac{1}{2})=12.5\%$ chance of a match condition and thus an 87.5% chance of a mismatch condition. Thus, the probability of a mismatch condition in a row of pre-compare CAM array 112 may be expressed as $1-\frac{1}{2}^n$, where n is the number of pre-compare bits and encoded search key bits that are compared with each other.

However, although advantageously increasing the percentage of mismatch conditions in pre-compare CAM array 112, increasing the number of pre-compare bits used in pre-compare operations with the encoded search key requires pre-compare CAM array 112 to include greater numbers of CAM cells in each of its rows. As the number of CAM cells in each row of pre-compare CAM array 112 increases, capacitive loading on each pre-compare match line increases, which in turn undesirably increases the power consumption associated with pre-charging the pre-compare match lines of pre-compare CAM array 112 for pre-compare operations with the encoded search key. As a result, decreases in power consumption of pre-charging the match lines of main CAM array 116 realized by increasing the number of pre-compare bits used in pre-compare operations must be balanced with corresponding increases in power consumption of pre-charging the match lines in pre-compare CAM array 112 resulting from larger numbers of CAM cells in the rows of pre-compare CAM array 112.

If the number of CAM cells in rows of main CAM array 116 is much greater than the number of CAM cells in rows of pre-compare CAM array 112, match line pre-charge currents for main CAM array 116 will be much greater than match line pre-charge currents for pre-compare CAM array 112. Thus, for some embodiments, an optimal balance between reductions in pre-charge currents for main CAM array 116 and corresponding increases in pre-charge currents for pre-compare CAM array 112 may be achieved by configuring rows of main CAM array 116 to have several orders of magnitude more CAM cells than corresponding rows of pre-compare CAM array 112. For one embodiment, each row in pre-compare CAM array 112 includes 5 CAM cells, and each row in main CAM array 116 includes 320 CAM cells. For this embodiment, in which pre-compare CAM array 112 stores sets of five pre-compare bits, the probability of a row in the pre-compare CAM array having a mismatch condition is $1-\frac{1}{2}^5 \approx 97\%$.

The percentage of mismatch conditions in pre-compare CAM array 112 may also be maximized by selecting the logical function performed by function generators 161 and 162 according to expected bit patterns in CAM words that are to be stored in main CAM array 116. For example, if the CAM words to be stored in main CAM array 116 are expected to contain more 1's than 0's, then performing a first logical function (e.g., a logical AND function) on the CAM words to generate corresponding sets of pre-compare bits may increase the percentage of mismatch conditions in pre-compare CAM array 112. Conversely, if the CAM words to be stored in main CAM array 116 are expected to contain more 0's than 1's, then performing a second logical function (e.g., a logical OR function) on the CAM words to generate corresponding sets of pre-compare bits may increase the percentage of mismatch conditions in pre-compare CAM array 112.

Figure 3:
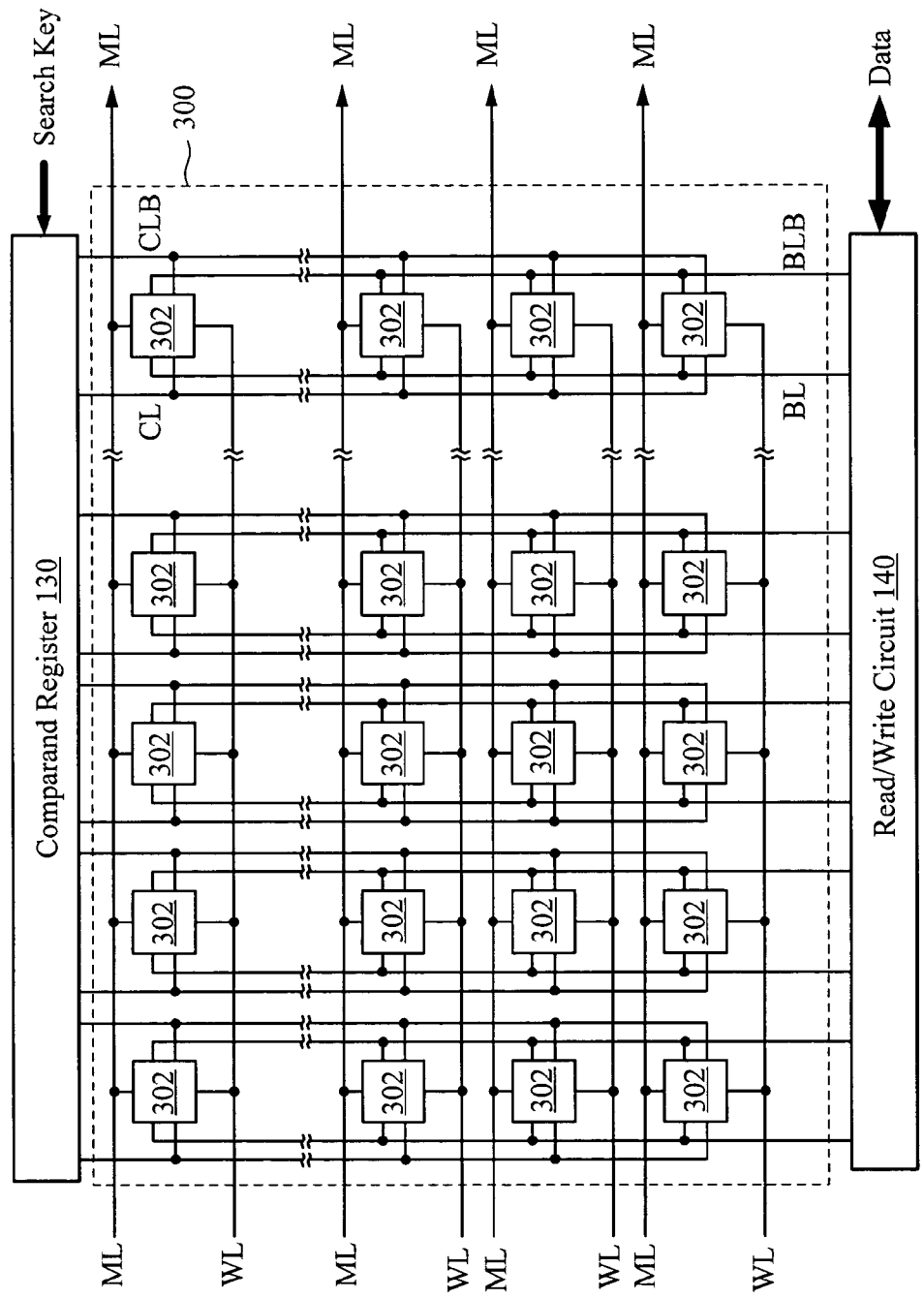
FIG. 3 is a block diagram of one embodiment of the main CAM array of FIG. 1.

FIG. 3 shows a CAM array 300 that is one embodiment of main CAM array 116 of FIG. 1. Array 300 includes a plurality of CAM cells 302 organized in any number of rows and columns. CAM cells 302 may be any suitable well-known SRAM-based, DRAM-based, or non-volatile binary CAM cell. As noted above, each row of CAM array 300 may also include one or more validity bits. Each row of CAM cells 302 is coupled to a main match line ML and to a word line WL. Each word line WL is driven by address decoder 120 (see also FIG. 1) to select one or more rows of CAM cells 302 for writing or reading. Each main match line ML is coupled to match line control logic 114 and provides the match results of a compare operation between the search key and a CAM word to priority encoder 150 and to match logic 160. Each column of CAM cells 302 in main CAM array 300 is coupled to a complementary bit line pair BL and BLB and to a complementary comparand line pair CL and CLB. The bit line pairs BL/BLB are each coupled to read/write circuit 140, and the comparand line pairs CL/CLB are each coupled to comparand register 130.

During compare operations, a main match line ML indicates a match condition for the row only if all CAM cells 302 in that row match the search key. As described above, for some embodiments, the main match lines ML are selectively pre-charged for compare operations with the search key in response to match results in pre-compare CAM array 112. If any CAM cell 302 in the row does not match the search key, the CAM cell(s) 302 discharges the main match line ML toward ground potential (i.e., logic low) to indicate the mismatch condition. Conversely, if all CAM cells 302 match the search key, the main match line ML remains in a charged (i.e., logic high) state to indicate the match condition.

Figure 4:
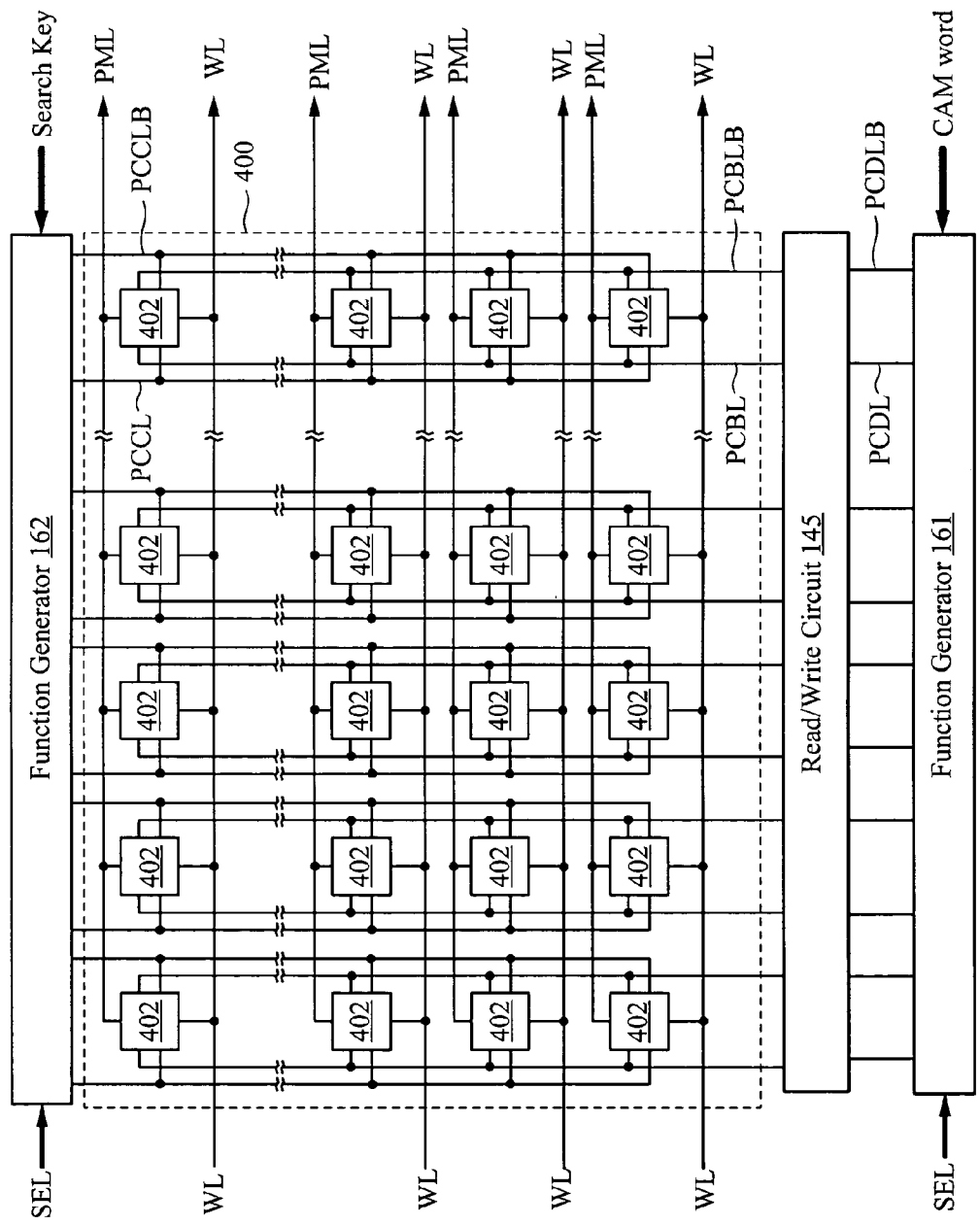
FIG. 4 is a block diagram of one embodiment of the pre-compare CAM array of FIG. 1.

FIG. 4 shows a CAM array 400 that is one embodiment of pre-compare CAM array 112 of FIG. 1. Array 400 includes a plurality of CAM cells 402 organized in any number of rows and columns. Thus, although shown in FIG. 4 as including multiple columns of CAM cells, for some embodiments, pre-compare CAM array 400 may include a single column of CAM cells (e.g., for embodiments in which a single pre-compare bit is generated in response to a corresponding CAM word). CAM cells 402 may be any suitable well-known SRAM-based, DRAM-based, or non-volatile binary CAM cell. For some embodiments, CAM cells 402 of FIG. 4 and CAM cells 302 of FIG. 3 are identical, although for other embodiments CAM cells 302 and CAM cells 402 may be of different architectures. Further, although not shown in FIG. 4, for some embodiments, each row of pre-compare CAM array 400 may include one or more validity bits.

The architecture and operation of pre-compare CAM array 400 is similar to that of main CAM array 300 of FIG. 3, except that columns of CAM cells 402 in pre-compare CAM array 400 are coupled to read/write circuit 145 via corresponding pre-compare bit line pairs PCBL/PCBLB and are coupled to second function generator 162 via corresponding pre-compare comparand line pairs PCCL/PCCLB. During write operations, first function generator 161 generates a set of pre-compare bits by performing a logical function on a corresponding CAM word, and read/write circuit 145 writes the set of pre-compare bits to a row of CAM cells 402 selected by address decoder 120. During pre-compare operations, second function generator 162 generates an encoded search key by performing the logical function on the search key, and drives the encoded search key into CAM array 400 via PCCL/PCCLB for comparison with the sets of pre-compare bits. For the embodiment of FIG. 4, each pre-compare match line PML provides the match results of a pre-compare operation between the encoded search key and a corresponding set of pre-compare bits to match line control logic 114 (see also FIG. 1), which in response thereto selectively pre-charges corresponding match lines in the main CAM array in the manner described above.

For alternate embodiments, other CAM array architectures may be used for main CAM array 300 and for pre-compare CAM array 400. For example, in some embodiments, CAM arrays 300 and 400 may not include complementary comparand lines, in which case the complementary bit lines may be used to perform a compare operation as is generally known in the art. Further, although described above in the context of NOR-based CAM arrays, for other embodiments CAM arrays 300 and 400 may be NAND-based CAM arrays. In addition, for some embodiments, corresponding rows of pre-compare CAM array 400 and main CAM array 300 share the same word line WL, which as described above may be selected for read and write operations by address decoder 120 in response to a suitable input address. For other embodiments, pre-compare CAM array 400 may have word lines that are separate from the word lines of main CAM array 300.

Figure 5:
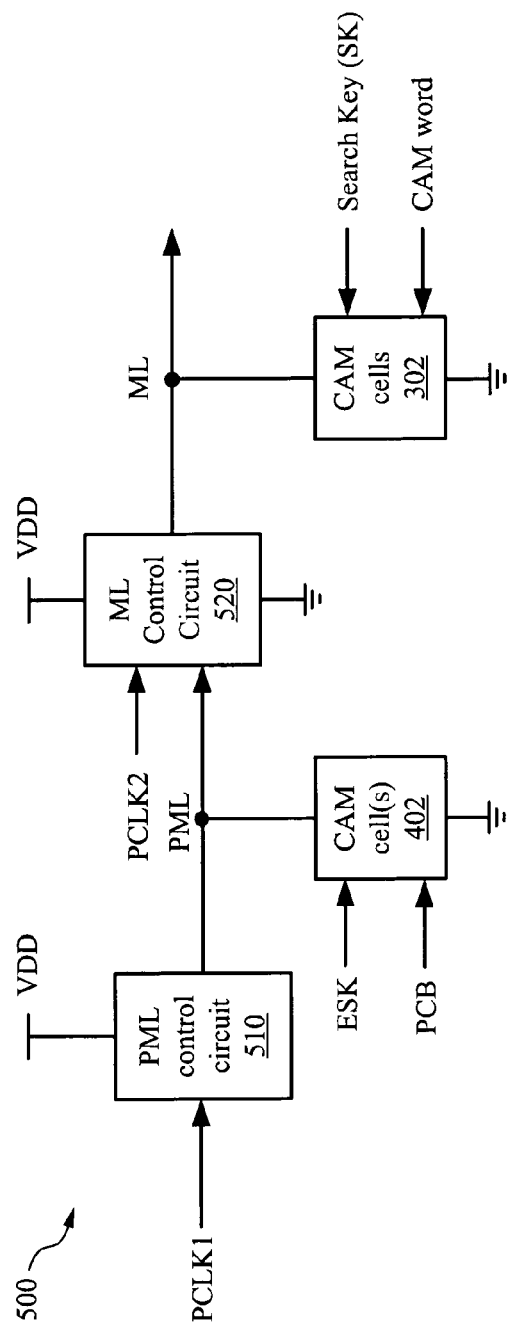
FIG. 5 is a simplified block diagram of one embodiment of a row of the CAM array of FIG. 1.

FIG. 5 is a block diagram of a row 500 that is one embodiment of the rows in CAM array 110 of FIG. 1. Row 500 is shown to include a pre-compare match line (PML) control circuit 510, a match line (ML) control circuit 520, one or more pre-compare CAM cells 402, and a plurality of main CAM cells 302. For simplicity, the pre-compare CAM cells 402, which form a row in pre-compare CAM array 112, and the plurality of main CAM cells 302, which form a row in main CAM array 116, are represented collectively in FIG. 5. Further, although not shown for simplicity, pre-compare CAM cells 402 and main CAM cells 302 are each coupled to a corresponding word line that can be selected for read and write operations by address circuit 120 (see also FIG. 1).

PML control circuit 510 includes an input to receive a first pre-charge signal PCLK1, and an output coupled to the pre-compare match line PML. Pre-compare CAM cells 402, which are connected between PML and ground potential, include data inputs to receive the pre-compare bits PCB and include compare inputs to receive the encoded search key ESK. ML control circuit 520, which is one embodiment of match line control logic 114 for a corresponding row in the main CAM array, is connected between the main match line ML and ground potential, and includes a first input coupled to PML, a second input to receive a second pre-charge signal PCLK2, and an output coupled to ML. Main CAM cells 302, which are connected between ML and ground potential, include data inputs to receive the CAM words and include compare inputs to receive the search key SK. For other embodiments, PCLK1 and/or PCLK2 may be eliminated.

An exemplary compare operation for one embodiment of row 500 is described below with respect to the illustrative timing diagram of FIG. 6. Prior to the compare operation, a CAM word is stored in main CAM cells 302 and a corresponding set of pre-compare bits generated from the CAM word (e.g., by function generator 161) is stored in pre-compare CAM cells 402. At time t1, a compare instruction is issued, CLK transitions to logic high, and PCLK1 is asserted to logic high (e.g., towards VDD). The logic high state of PCLK1 cause PML control circuit 510 to pre-charge PML toward VDD (e.g., to logic high). At time t2, PCLK2 transitions to logic low which, for some embodiments, causes PML control circuit 510 to stop pre-charging PML. Shortly thereafter, the encoded search key (ESK) is compared with the set of pre-compare bit(s) stored in pre-compare CAM cell(s) 402 at time t3 to generate match results on PML at time t4. If there is a match in all of CAM cells 402, PML remains in its pre-charged high logic state (as indicated by the PCB MATCH line for PML). Conversely, if there is a mismatch in any of CAM cells 402, PML is discharged toward ground potential (as indicated by the PCB MISMATCH line for PML).

At time t5, PCLK2 is asserted to logic high to enable ML control circuit 520 to latch the pre-compare match results on PML. If PML is logic low, thereby indicating a mismatch condition in pre-compare CAM cells 402, ML control circuit 520 does not pre-charge ML (as indicated by the PCB MISMATCH line for ML), thereby saving power consumption associated with pre-charging ML. For some embodiments, ML control circuit 520 discharges ML to toward ground potential in response to a mismatch condition on PML, which in turn forces a mismatch condition on ML prior to compare operations in main CAM cells 302.

Conversely, if PML is logic high, thereby indicating a match condition in pre-compare CAM cells 402, ML control circuit 520 pre-charges ML toward VDD (e.g., to logic high) to enable the detection of match results in main CAM cells 302. At time t6, PCLK2 is de-asserted to logic low which, for some embodiments, causes ML control circuit 520 to reduce or even terminate the ML pre-charge current. Shortly thereafter, the search key is compared with the CAM word stored in CAM cells 302 at time t7 to generate match results on ML at time t8. If there is a match in main CAM cells 302, ML remains in its pre-charged high logic state (as indicated by the Data MATCH line for ML) to indicate the match condition. Conversely, if there is a mismatch in main CAM cells 302, ML is discharged toward ground potential (as indicated by the Data MISMATCH line for ML) to indicate the mismatch condition.

Many different logic circuits can be used to implement the logic function performed by match line control circuit 520 of FIG. 5. The logic function performed by match line control circuit 520 is summarized below in the truth table of Table 1, where "x" represents a don't care logic state.

TABLE 1

| PCLK | PML | ML |
| --- | --- | --- |
| 0 | x | 0 |
| 0 | x | 0 |
| 1 | 0 | 0 |
| 1 | 1 | 1 |

For some embodiments, match line control circuit 520 may include a pull-up circuit coupled between ML and VDD, and include a pull-down circuit coupled between ML and ground potential. For such embodiments, the pull-up circuit may quickly pre-charge ML upon assertion of PCLK2 when PML indicates a match between ESK and the pre-compare bits in pre-compare CAM cells 402, and the pull-down circuit may discharge ML upon assertion of PCLK2 when PML indicates a mismatch condition between ESK and the pre-compare bits in pre-compare CAM cells 402.

Figure 7A:
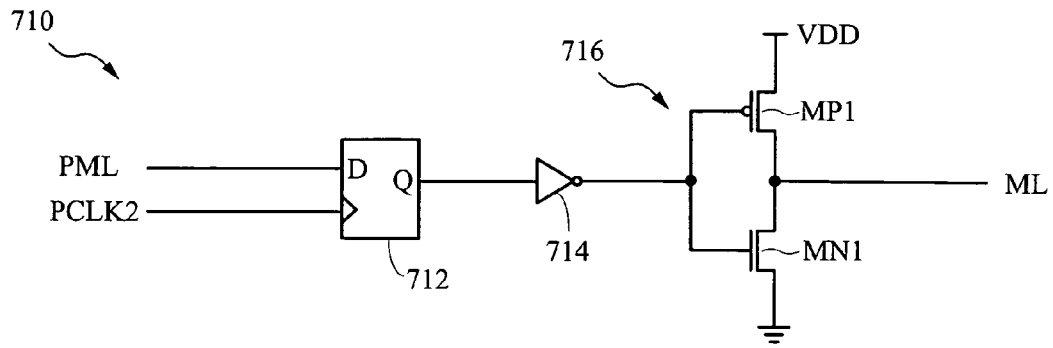
FIG. 7A is a circuit diagram of one embodiment of the main match line control circuit of FIG. 5.

For example, FIG. 7A shows a match line control circuit 710 that is one embodiment of match line control circuit 520 of FIG. 5. Match line control circuit 710 includes a latch 712, an inverter 714, and a charge/discharge circuit 716. Charge/discharge circuit 716 is shown in FIG. 7A as a CMOS inverter formed by a series connection of a PMOS transistor MP1 and an NMOS transistor MN1 between VDD and ground potential, with the gates of MP1 and MN1 providing an input for circuit 716 and the commonly-coupled drains of MP1 and MN1 providing an output for circuit 716. For other embodiments, other suitable charge/discharge circuits may be used. Latch 712 includes a data input coupled to PML, a clock input to receive PCLK2, and an output coupled to an input of inverter 714. Latch 712 may be any suitable circuit such as a flip-flop that drives its output in response to PML when PCLK2 is asserted. Inverter 714 includes an output coupled to the input of circuit 716, which includes an output coupled to ML.

When PCLK2 is asserted to logic high, the logic state of PML is clocked into latch 712, which in response thereto drives ML to the same logic state via inverter 714 and circuit 716. For example, if PML is asserted to logic high to indicate a match condition in a corresponding row of the pre-compare CAM array, the logic high state of PML is latched by latch 712 and provided to inverter 714, which in response thereto drives the gates of MP1 and MN1 to logic low. In response thereto, MP1 turns on to quickly charge ML toward VDD (e.g., to a pre-charged logic high state), and MN1 turns off to isolate ML from ground potential. In this manner, match line control circuit 710 allows compare operations in a row of the main CAM array to generate match results on ML when there is a pre-compare match condition in the corresponding row of the pre-compare CAM array.

Conversely, if PML is de-asserted to logic low to indicate a mismatch condition in the row of the pre-compare CAM array, the logic low state of PML is latched by latch 712 and provided to inverter 714, which in response thereto drives the gates of MP1 and MN1 to logic high. In response thereto, MN1 turns on to quickly discharge ML toward ground potential (e.g., to a discharged logic low state), and MP1 turns off to isolate ML from VDD. In this manner, match line control circuit 710 forces a mismatch condition in the row of the main CAM array without pre-charging and then discharging ML, thereby reducing power consumption in the main CAM array.

For other embodiments, match line control circuit 520 may also include an additional pull-up circuit that provides a constant, relatively weak pre-charge current for the corresponding match line to maintain the match line in its logic high state during match conditions in the corresponding row of the main CAM array.

Figure 7B:
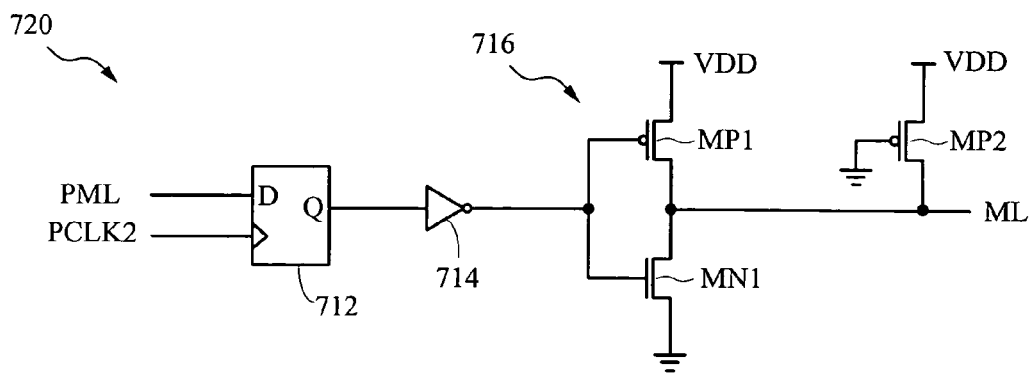
FIG. 7B is a circuit diagram of another embodiment of the main match line control circuit of FIG. 5.

For one example, FIG. 7B shows a match line control circuit 720 that is another embodiment of match line control circuit 520 of FIG. 5. In addition to the elements of match line control circuit 710, match line control circuit 720 includes a weak PMOS pull-up transistor MP2 coupled between VDD and ML and having a gate coupled to ground potential to maintain MP2 in a conductive state. MP2 continually provides a relatively weak pre-charge current for ML to assist maintaining ML in its logic high state during match conditions in the main CAM cells 302. For some embodiments of FIG. 7B, MP1 is much stronger than MP2, and thus provides a relatively strong pre-charge current to quickly pre-charge ML toward VDD when PML and PCLK2 are both asserted.

For other embodiments of match line control circuits 710 and 720, NMOS pull-down transistor MN1 may be eliminated so that ML is not discharged to ground potential in response to pre-compare mismatch conditions indicated on PML.

Figure 8:
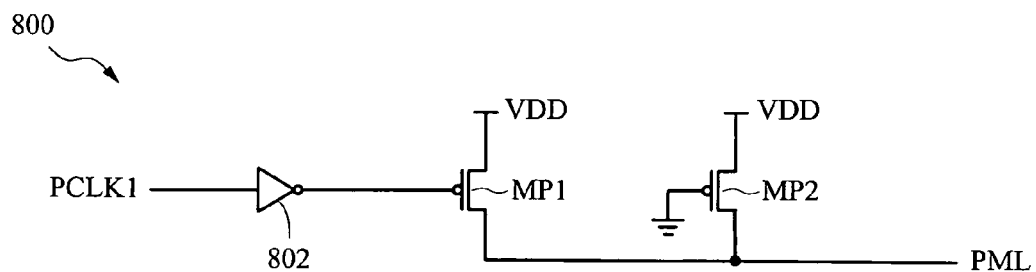
FIG. 8 is a circuit diagram of one embodiment of the pre-compare match line control circuit of FIG. 5.

FIG. 8 shows a pre-compare match line control circuit 800 that is one embodiment of PML control circuit 510 of FIG. 5. PML control circuit 800 includes an inverter 802, a first pull-up circuit formed by the relatively strong transistor MP1, and a second pull-up circuit formed by the relatively weak transistor MP2. MP1 selectively provides a relatively strong pre-charge current for PML in response to PCLK1, and MP2 continually provides a relatively weak pre-charge current for PML to maintain PML in its pre-charged logic high state during pre-compare match conditions on PML. For other embodiments, transistor MP2 may be eliminated.

As mentioned above, the rows of pre-compare CAM array 112 may include any number of CAM cells to store a corresponding number of pre-compare bits. For some embodiments, all the bits of each CAM word stored in main CAM array 116 are used by first function generator 161 to generate a single pre-compare bit. Thus, for such embodiments, each row of pre-compare CAM array 112 may include a single CAM cell to store a pre-compare bit generated in response to a logical combination of all the bits of the CAM word stored in a corresponding row of main CAM array 116.

Figure 9A:
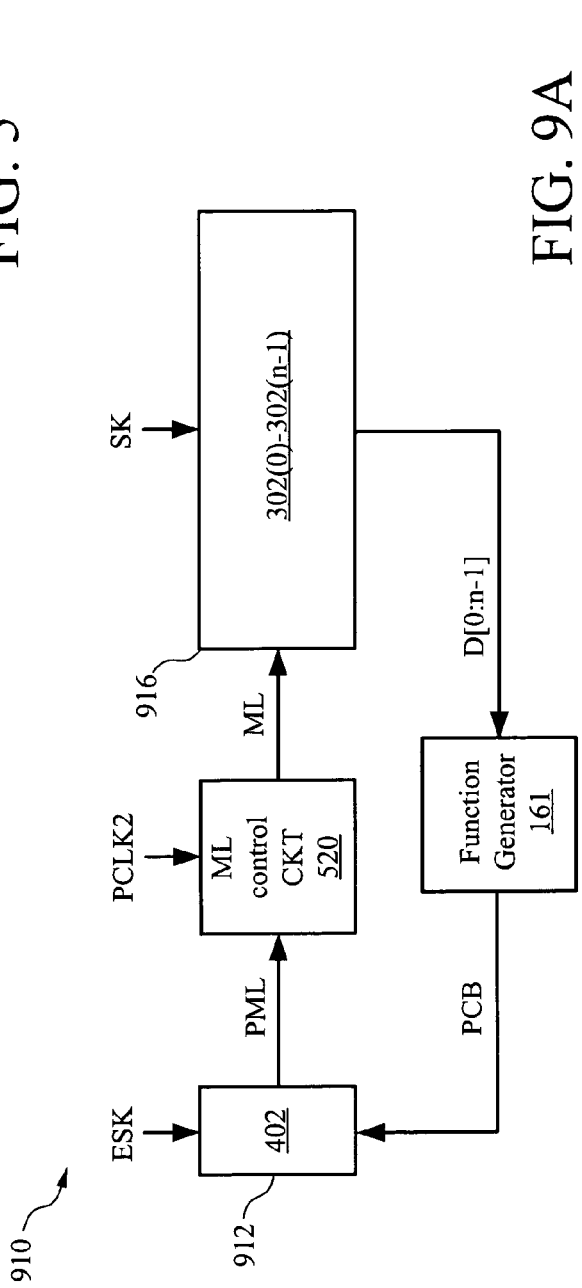
FIG. 9A is a simplified block diagram illustrating generation of pre-compare bits for one embodiment of the row of FIG. 5.

For example, FIG. 9A shows a simplified row 910 that is one embodiment of row 500 of FIG. 5. Row 910 is shown to include a row 912 in pre-compare CAM array 112, a row 916 in main CAM array 116, and match line control circuit 520. Main CAM row 916 includes a number n of CAM cells 302(0)–302(n–1) to store an n-bit CAM word D[0:n–1], and pre-compare CAM row 912 includes a single CAM cell 402 to store one pre-compare bit (PCB) generated by first function generator 161 in response to D[0:n–1]. For simplicity, word lines, second function generator 162, pre-compare match line control circuit 510, individual CAM cells in pre-compare row 912 and main CAM row 916, and other components of CAM device 100 described above are not shown in FIG. 9A. Alternately, first function generator 161 may perform a logical function on the entire CAM word D[0:n–1] to generate a plurality of pre-compare bits to be stored in CAM cells 402 of the pre-compare row.

For other embodiments, a number of subsets of each CAM word may each be used to generate a corresponding one of a number of pre-compare bits. Thus, for such embodiments, the rows of main CAM array 116 may include a number of row segments each for storing a corresponding portion of the CAM word, and the rows of pre-compare CAM array 112 may include a number of CAM cells for storing a set of pre-compare bits generated in response to various bit combinations of CAM word.

Figure 9B:
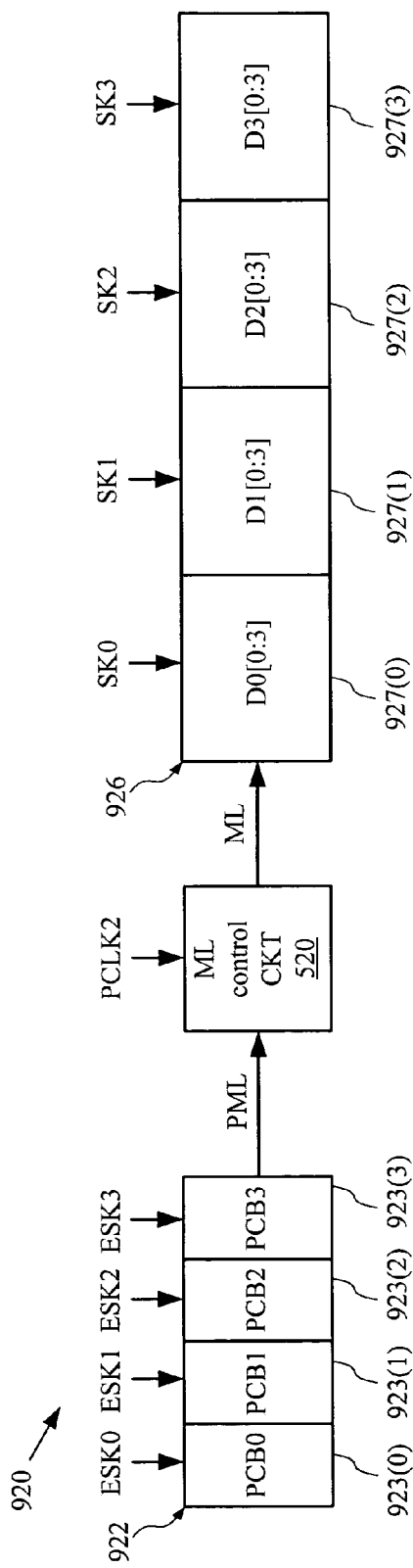
FIG. 9B is a simplified block diagram depicting one segmented embodiment of the row of FIG. 5.

For example, FIG. 9B shows a simplified row 920 that is another embodiment of row 500 of FIG. 5. Row 920 is shown to include a row 922 in pre-compare CAM array 112, a row 926 in main CAM array 116, and match line control circuit 520. Main CAM row 926 is shown to include 4 row segments 927(0)–927(3), each including CAM cells to store respective 4-bit portions D0[0:3], D1[0:3], D2[0:3], and D3[0:3] of a CAM word, and pre-compare CAM row 922 is shown to include four segments 923(0)–923(3), each including a CAM cell for storing a corresponding pre-compare bit (PCB). Each segment 923(0)–923(3) is coupled to receive a corresponding encoded search key portion ESK0–ESK3, and each segment 927(0)–927(3) is coupled to receive a corresponding search key portion SK0–SK3. Although shown in FIG. 9B as including four row segments 927(0)–927(3), for actual embodiments, main CAM row 926 may include any number of row segments 927, and each row segment 927 may include any number of CAM cells. Similarly, pre-compare CAM row 922 may include any number of corresponding segments 923. For simplicity, word lines, function generators 161–162, pre-compare match line control circuit 510, individual CAM cells in pre-compare row 922 and main CAM row 926, and other components of CAM device 100 described above are not shown in FIG. 9B.

For first embodiments of FIG. 9B, each pre-compare bit stored in a pre-compare CAM row segment 923 is generated by performing a selected logical function on the CAM word portion stored in a corresponding row segment 927 of main CAM row 926. Generation of the pre-compare bits for these first embodiments of row 920 may be expressed as PCB0=$f_1$ {D0[0:3]}, PCB1=$f_1$ {D1[0:3]}, PCB2=$f_1$ {D2[0:3]}, and PCB3=$f_1$ {D3[0:3]}, where $f_1$ represents the predetermined logical function performed by function generator 161. For example, if the predetermined logical function $f_1$ is an XOR function, generation of the pre-compare bits may be expressed as PCB0=D0[0]⊕D0[1]⊕D0[2]⊕D0[3], PCB1=D1[0]⊕D1[1]⊕D1[2]⊕D1[3], PCB2=D2[0]⊕D2[1]⊕D2[2]⊕D2[3], and PCB3=D3[0]⊕D3[1]⊕D3[2]⊕D3[3]. For these first embodiments of FIG. 9B, the number of CAM cells in pre-compare CAM row 922 is equal to the number of row segments 927 in main CAM row 926, and thus the number of pre-compare bits is equal to the number of CAM word portions.

For second embodiments of FIG. 9B, each pre-compare bit stored in pre-compare CAM row 922 is generated by performing a selected logical function on similarly positioned bits of the CAM word portions stored in main row segments 927(0)–927(3). Generation of the pre-compare bits for these second embodiments of row 920 may be expressed as PCB0=$f_1$ {D0[0], D1[0], D2[0], D3[0]}, PCB1=$f_1$ {D0[1], D1[1], D2[1], D3[1]}, PCB2=$f_1$ {D0[2], D1[2], D2[2], D3[2]}, and PCB3=$f_1$ {D0[3], D1[3], D2[3], D3[3]}. For example, if the predetermine logical function $f_1$ is an XOR function, PCB0=D0[0]⊕D1[0]⊕D2[0]⊕D3[0], PCB1=D0[1]⊕D1[1]⊕D2[1]⊕D3[1], PCB2=D0[2]⊕D1[2]⊕D2[2]⊕D3[2], and PCB3=D0[3]⊕D1[3]⊕D2[3]⊕D3[3]. For these second embodiments of FIG. 9B, the number of CAM cells in pre-compare CAM row 922 is equal to the number of CAM cells within each row segment 927 of main CAM row 926, and thus the number of pre-compare bits is equal to the number of bits in each CAM word portion.

Generating the pre-compare bits according to second embodiments of row 920 may result in a greater percentage of mismatch conditions in pre-compare CAM array 112 when the CAM words stored in main CAM array 116 are similar (e.g., when main CAM array 116 stores similar IP forwarding addresses), which in turn may further increase reductions in power consumption achieved by present embodiments.

Figure 9C:
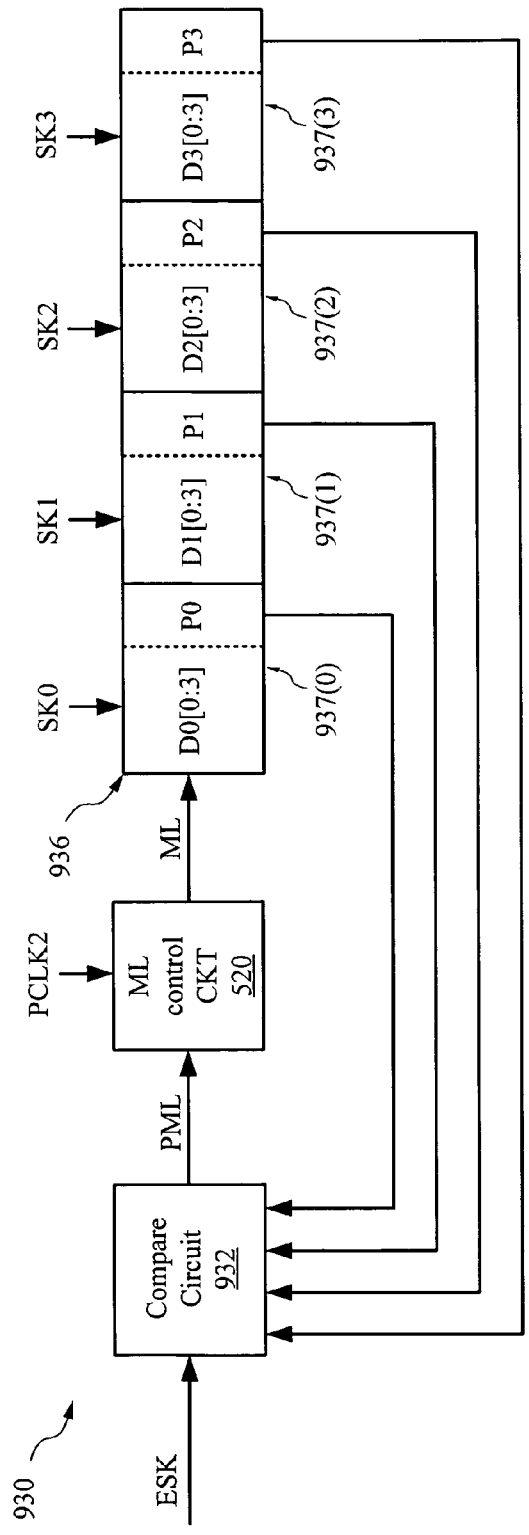
FIG. 9C is a simplified block diagram depicting another segmented embodiment of the row of FIG. 5.

Further, as mentioned above, the pre-compare bit(s) that are generated by performing a logical function on corresponding CAM words may be well-known parity bits. For example, FIG. 9C shows a simplified row 930 that is yet another embodiment of row 500 of FIG. 5. Row 930 is shown to include a compare circuit 932, a row 936 of CAM cells in main CAM array 116, and match line control circuit 520. For simplicity, word lines, function generators 161–162, pre-compare match line control circuit 510, the individual CAM cells in main CAM row 936, as well as other components of CAM device 100 described above, are not shown in FIG. 9C. For the exemplary embodiment of FIG. 9C, main CAM row 936 is shown to include 4 row segments 937(0)–937(3), each for storing a corresponding 4-bit portion D[0:3] of a CAM word and a parity bit P for the corresponding CAM word portion, and each segment 937(0)–937(3) is coupled to receive a corresponding search key portion SK0–SK3. For actual embodiments, main CAM row 936 can include any number of row segments 937, and each row segment 937 may include any number of CAM cells. For some embodiments, the parity bits P0–P3 for corresponding CAM word portions D0–D3 may be stored in suitable storage elements (e.g., CAM cells, SRAM cells, DRAM cells, and the like) within corresponding row segments 937(0)–937(3), as illustrated in FIG. 9C. For other embodiments, the parity bits P0–P3 may be stored in suitable storage elements external to main CAM row 936, for example, in pre-compare CAM array 112.

For the embodiment of FIG. 9C, the parity bits P0–P3 may be generated from corresponding CAM word portions D0–D3 using well-known error checking circuitry such as, for example, that described in U.S. Pat. No. 6,597,595. Thus, for embodiments that include circuitry to generate parity bits for the CAM words stored in main CAM array 116, function generator 161 and pre-compare CAM array 112 may not be necessary and may be replaced by compare circuits 932. However, function generator 162 should be configured to generate the encoded search key ESK from the search key using the same logical function that is used to generate the parity bits for CAM word portions stored in main CAM row 936. During compare operations, the parity bits P0–P3 are forwarded from main CAM row 936 to corresponding first inputs of compare circuit 932, which includes a second input to receive ESK and includes an output to provide pre-compare match results to match line control circuit 520 via PML. Compare circuit 932, which may be of a conventional architecture, is configured to compare the parity bits P0–P3 with ESK to generate pre-compare match results on PML. Thus, if the parity bits match ESK, compare circuit 932 asserts PML to logic high, which in turn causes match line control circuit 520 to pre-charge ML to enable detection of match results in main CAM row 936. Conversely, if the parity bits do not match ESK, compare circuit 932 de-asserts PML to logic low, which in turn cause match line control circuit to not pre-charge ML, thereby reducing power consumption associated with pre-charging main match lines ML.

Figure 10:
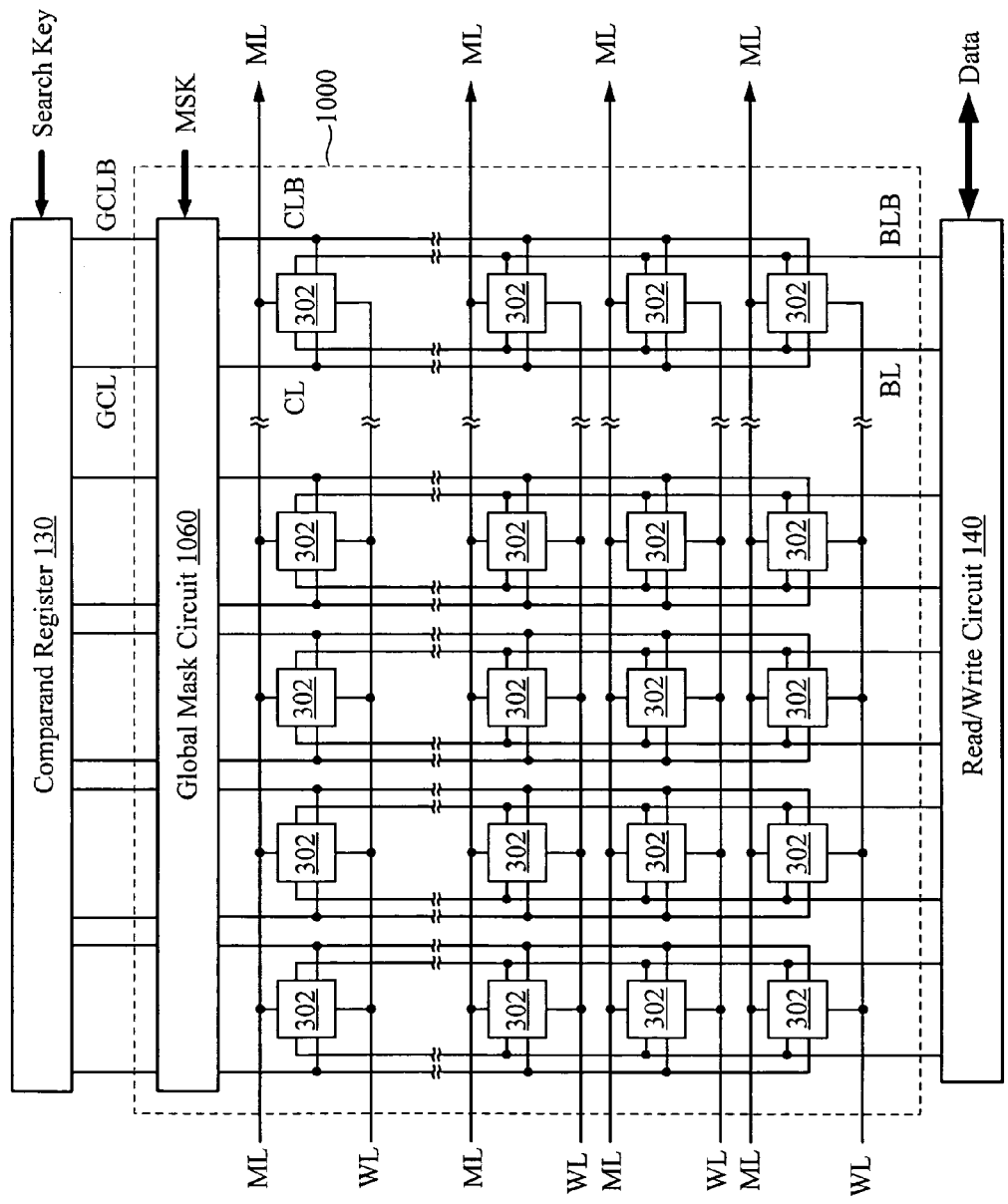
FIG. 10 is a block diagram of another embodiment of the main CAM array of FIG. 1 shown to include a main global mask circuit.

FIG. 10 shows a CAM array 1000 that is another embodiment of main CAM array 116 of FIG. 1. The architecture and operation of main CAM array 1000 is similar to that described above with respect to main CAM array 300 of FIG. 3, except that main CAM array 1000 includes a main global mask circuit 1060 that stores a main global mask word MSK for selectively masking corresponding bits of all the CAM words stored in main CAM array 1000 during a compare operation with the search key SK. Global mask circuit 1060 is coupled to comparand register 130 via complementary global comparand line pairs GCL/GLCB, and is coupled to columns of CAM cells 302 in main CAM array 1000 via corresponding comparand line pairs CL/CLB. For compare operations, comparand register 130 provides the search key (e.g., from CBUS) to global mask circuit 1060 via global comparand line pairs GCL/GCLB. In response to the main global mask word MSK stored therein, global mask circuit 1060 provides a selectively masked search key to main CAM array 1000 for comparison with entries stored therein via comparand lines CL/CLB.

For purposes of discussion herein, an asserted (e.g., logic high) main global mask bit masks a corresponding bit comparison between the search key and each CAM word stored in main CAM array 1000, and a de-asserted main global mask bit allows the corresponding bit comparison between the search key and each CAM word to generate match results on the main match lines ML. For one embodiment, if a global mask bit is asserted, global mask circuit 1060 drives the associated comparand line pair CL/CLB to the same predetermined state (e.g., logic 0) so that CAM cells 302 in the corresponding column of main CAM array 1000 indicate a match condition regardless of data stored therein, thereby effectively masking similarly positioned bits of each CAM word. Conversely, if the global mask bit is de-asserted, global mask circuit 1060 drives the associated comparand line pair CL/CLB in response to the corresponding bit of the search key, thereby allowing bit comparisons between the search key and the CAM words to affect the match line signals.

Figure 11:
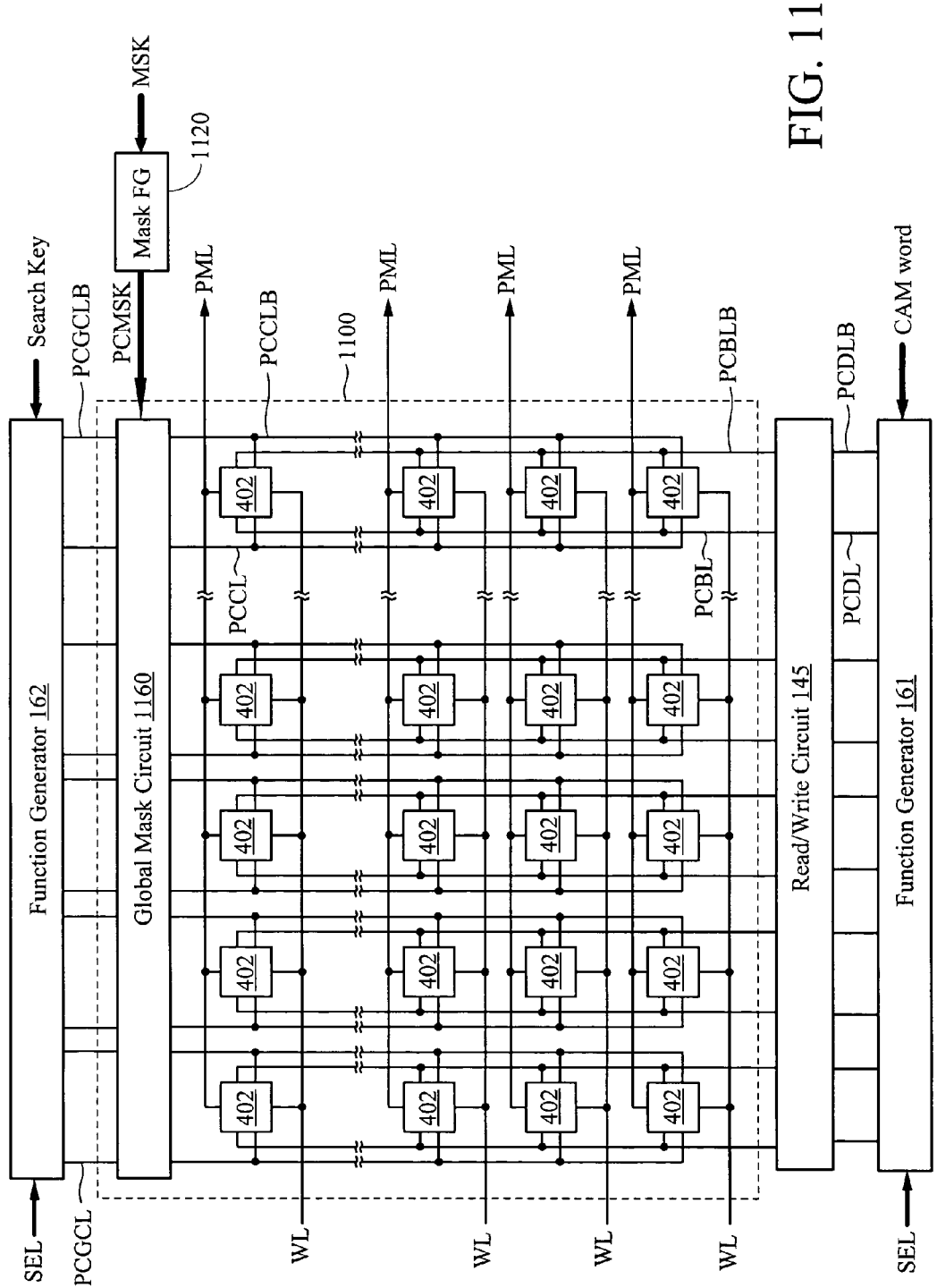
FIG. 11 is a block diagram of another embodiment of the pre-compare CAM array of FIG. 1 shown to include a pre-compare global mask circuit.

FIG. 11 shows a CAM array 1100 that is another embodiment of pre-compare CAM array 112 of FIG. 1. Array 1100 includes a plurality of CAM cells 402 organized in any number of rows and columns. Thus, although shown in FIG. 11 as including multiple columns of CAM cells, for some embodiments, pre-compare CAM array 1100 may include a single column of CAM cells (e.g., for embodiments in which a single pre-compare bit is generated in response to a corresponding CAM word). CAM cells 402 may be any suitable well-known SRAM-based, DRAM-based, or non-volatile binary CAM cell. For some embodiments, CAM cells 402 of FIGS. 4 and 11 are identical to CAM cells 302 of FIGS. 3 and 10, respectively, although for other embodiments CAM cells 302 and CAM cells 402 may be of different architectures. Further, although not shown in FIG. 11, for some embodiments, each row of pre-compare CAM array 1100 may include one or more validity bits.

The architecture and operation of pre-compare CAM array 1100 is similar to that of pre-compare CAM array 400 of FIG. 4, except that pre-compare CAM array 1100 includes a global pre-compare mask circuit 1160 that stores a pre-compare global mask word PCMSK that selectively masks corresponding bits of the pre-compare bit sets during a pre-compare operation with the encoded search key. Global pre-compare mask circuit 1160 is coupled to second function generator 162 via complementary pre-compare global comparand line pairs PCGCL/PCGCLB, and is coupled to columns of CAM cells 402 in pre-compare CAM array 1100 via corresponding pre-compare comparand line pairs PCCL/PCCLB. During write operations, first function generator 161 generates a set of pre-compare bits by performing a predetermined logical function on a corresponding CAM word, and read/write circuit 145 writes the set of pre-compare bits to a row of CAM cells 402 selected by address decoder 120 via word lines WL. During pre-compare operations, second function generator 162 generates an encoded search key by performing the predetermined logical function on the search key, and provides the encoded search key to pre-compare global mask circuit 1160. In response to the pre-compare global mask word stored therein, pre-compare global mask circuit 1160 provides a selectively masked encoded search key to pre-compare CAM array 1100 for comparison with entries stored therein via pre-compare comparand lines PCCL/PCCLB.

For purposes of discussion herein, an asserted (e.g., logic high) pre-compare global mask bit masks a corresponding bit comparison between the encoded search key and each pre-compare bit set stored in pre-compare CAM array 1100, and a de-asserted pre-compare global mask bit allows the corresponding bit comparison between the encoded search key and the pre-compare bit sets to affect match results on the pre-compare match lines PML. For one embodiment, if a pre-compare global mask bit is asserted, global mask circuit 1160 drives the associated pre-compare comparand line pair PCCL/PCCLB to the same predetermined state (e.g., logic 0) so that CAM cells 402 in the corresponding column of pre-compare CAM array 1100 indicate a match condition regardless of data stored therein, thereby effectively masking similarly positioned bits of each pre-compare bit set. Conversely, if the pre-compare global mask bit is de-asserted, global mask circuit 1160 drives the associated pre-compare comparand line pair PCCL/PCCLB in response to the corresponding bit of the encoded search key, thereby allowing bit comparisons between the encoded search key and the pre-compare bit sets to affect the pre-compare match line signals.

For other embodiments, the polarity of the main and pre-compare mask bits may be reversed so that a logic low mask bit masks corresponding bit comparisons in the CAM array and a logic high mask bit allows corresponding bit comparisons to generate match results in the CAM array.

A mask function generator 1120 performs a selected logical function on the main global mask word MSK to generate the pre-compare global mask word PCMSK. Mask function generator 1120, which may be implemented in a well-known manner, includes an input to receive MSK and an output to provide PCMSK to pre-compare global mask circuit 1160. For some embodiments, if any of the bits in MSK are asserted, mask function generator 1120 asserts one or more bits in PCMSK. Thus, for one embodiment in which a logic high mask bit masks corresponding bit comparisons and a logic low mask bit does not mask corresponding bit comparisons, mask function generator 1120 may be configured to perform a bit-wise logical OR operation on MSK to generate PCMSK. For another embodiment in which a logic low mask bit masks corresponding bit comparisons and a logic high mask bit does not mask corresponding bit comparisons, mask function generator 1120 may be configured to perform a bit-wise logical AND operation on MSK to generate PCMSK. In this manner, CAM words stored in main CAM array 1000 having a number of bits that are masked by MSK during compare operations with the search key and that may generate corresponding pre-compare bits which do not match the encoded search key during pre-compare operations in pre-compare CAM array 1100 are not inadvertently precluded from the compare operation by pre-compare CAM array 1100.

For some embodiments, mask function generator 1120 performs the bit-wise logical operation on all bits of MSK to generate a single-bit PCMSK. For other embodiments, each row of main CAM array 1000 may include a plurality of segments with each row segment storing a corresponding portion of the CAM word, for example, in the manner described above with respect to FIG. 9A. For such embodiments, main global mask circuit 1060 may include a similar number of segments to store corresponding portions of MSK, and mask function generator 1120 may be configured to perform the bit-wise logical operation on each portion of MSK to generate a corresponding bit of PCMSK. For an exemplary embodiment in which each row of main CAM array 1000 includes four segments of CAM cells for storing respective 4-bit portions D0[0:3], D1[0:3], D2[0:3], and D3[0:3] of a CAM word, main global mask circuit 1060 may include four segments, each for storing respective 4-bit portions MSK0[0:3], MSK1[0:3], MSK2[0:3], and MSK3[0:3] of the main global mask word. For this example, mask function generator 1120 may generate four corresponding pre-compare mask bits PCMSK[0:3], where PCMSK[0]= $f_m\{MSK0[0:3]\}$, PCMSK[1]=$f_m\{MSK1[0:3]\}$, PCMSK[2]=$f_m\{MSK2[0:3]\}$, and PCMSK[3]=$f_m\{MSK3[0:3]\}$, where $f_m$ is the selected bit-wise logical operation performed by mask function generator 1120. For other embodiments, mask function generator 1120 may perform other logical functions on MSK to generate PCMSK.

For another embodiment, mask function generator 1120 may be configured to generate PCMSK by performing the selected logical function (e.g., the bit-wise logical OR operation) on a selected portion or subset of MSK such as, for example, a selected number of its most significant bits (MSBs).

Further, although shown in FIG. 10 as having one global mask circuit 1060 for storing one global main mask, other embodiments of main CAM array 1000 may include any number of main global mask circuits, each for storing a corresponding main global mask word for masking CAM words stored in main CAM array 1000. Similarly, other embodiments of pre-compare CAM array 1100 may include circuitry (e.g., a multiplexer) that provides the selected MSK to mask function generator 1120 to generate PCMSK.

For alternate embodiments, other CAM array architectures may be used for main CAM array 1000 and for pre-compare CAM array 1100. For example, in some embodiments, CAM arrays 1000 and 1100 may not include complementary comparand lines, in which case the complementary bit lines may be used to perform a compare operation as is generally known in the art. Further, although described above in the context of NOR-based CAM arrays, for other embodiments CAM arrays 1000 and 1100 may be NAND-based CAM arrays. In addition, for some embodiments, corresponding rows of pre-compare CAM array 1100 and main CAM array 1000 share the same word line WL, which as described above may be selected for read and write operations by address decoder 120 in response to a suitable input address. For other embodiments, pre-compare CAM array 1100 may have word lines that are separate from the word lines of main CAM array 1000. For another embodiment, CAM arrays 1000 and 1100 may have separate data bit lines and mask bit lines.

Figure 12:
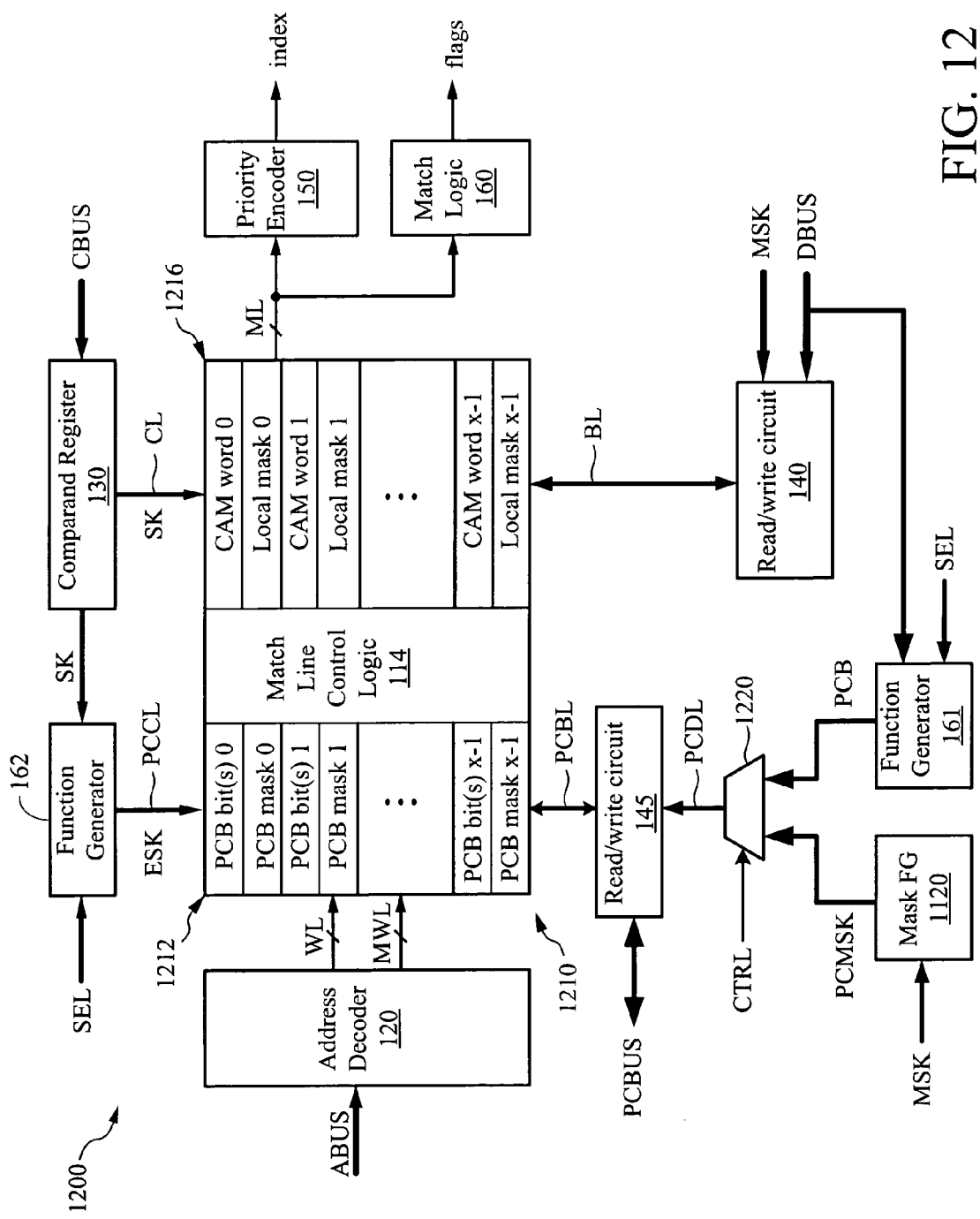
FIG. 12 is a block diagram of a ternary embodiment of the CAM device of FIG. 1.

Embodiments of the present invention may also be implemented in ternary CAM devices. For example, FIG. 12 shows a ternary CAM device 1200 that is another embodiment of CAM device 100 of FIG. 1. The architecture and operation of CAM device 1200 is similar to that of CAM device 100, except that CAM device 1200 includes a ternary CAM array 1210 rather than a binary CAM array 110. Ternary CAM array 1210 includes a ternary pre-compare CAM array 1212, a ternary main CAM array 1216, and match line control logic 114. Match line control logic 114 selectively pre-charges the match lines in main CAM array 1216 in response to pre-compare match results in pre-compare CAM array 1212 in a manner similar to that described above with respect to CAM array 100 of FIG. 1.

Each row in main ternary CAM array 1216 stores a CAM word and an associated main local mask word that stores masking data for the corresponding CAM word. For example, local mask word 0 stores masking data for CAM word 0, local mask word 1 stores masking data for CAM word 1, and so on. Thus, in contrast to global mask circuits (such as global mask circuit 1060 of FIG. 10) that mask entire columns of CAM cells, each main local mask word in main ternary CAM array 1216 masks only the corresponding CAM word on a bit-by-bit basis. Similarly, each row in pre-compare ternary CAM array 1212 stores a number of pre-compare bits (PCB bits) and an associated pre-compare local mask word (PCB mask) that masks the corresponding pre-compare bits on a bit-by-bit basis. The local masks in pre-compare CAM array 1212 and in main CAM array 1216 are coupled to address decoder 120 via corresponding mask word lines MWL. The mask word lines MWL, which are represented collectively in FIG. 10, may be asserted to select corresponding local mask words in both the pre-compare and main arrays of CAM device 1200 by address decoder 120 in response to a suitably presented address. For other embodiments, corresponding rows in pre-compare CAM array 1212 and in main CAM array 1216 may be coupled to address decoder via separate mask word lines. Further, although not shown in FIG. 12 for simplicity, each row in main CAM array 1216 and/or in pre-compare CAM array 1212 may include any number of validity bits. Other well-known components of CAM device 1200 such as clock and enable signals, instruction decoders, and so on are not shown for simplicity.

For the ternary embodiment of FIG. 12, read/write circuit 140 is shown to include an additional input to receive a main local mask word MSK. For other embodiments, MSK may be provided to read/write circuit 140 via DBUS. The main local mask words MSK may be written to and/or read from each of the local masks in main CAM array 1216 by read/write circuit 140 in a well-known manner. The main local masks may be selected for reading and writing by address decoder 120 by selectively asserting one of the mask word lines MWL in response to an input address. When a main local mask word MSK is provided to read/write circuit 140 to be written into a selected local mask in main CAM array 1216, MSK may also be provided to mask function generator 1120, which as described above with respect to FIGS. 10 and 11 performs a selected logical function (e.g., a bit-wise logical operation) on MSK to generate a corresponding pre-compare local mask word PCMSK.

Mask function generator 1120 provides PCMSK to a first input of multiplexer (MUX) 1220, which includes a second input to receive the pre-compare bits (PCB) from first function generator 161, a control terminal to receive a control signal CTRL, and an output coupled to read/write circuit 145. Thus, when CTRL is in a first state, MUX 1220 provides PCMSK to read/write circuit 145 to be written into the local mask portion of a selected row in pre-compare CAM array 1212, and when CTRL is in a second state, MUX 1220 provides PCB to read/write circuit 145 to be written into the data (e.g., PCB set) portion of a selected row in pre-compare CAM array 1212. CTRL may be generated by any suitable circuitry such as, for example, an instruction decoder (not shown) of CAM device 1200.

For other embodiments, a separate read/write circuit (not shown for simplicity) having an input to receive MSK and having outputs coupled to the bit line pairs of main CAM array 1216 may be used to write local mask words to and read local mask words from rows of main CAM array 1216 selected by address decoder 120 via MWL. Also, for other embodiments, first function generator 161 may be coupled directly to read/write circuit 145, and device 1200 may include a separate read/write circuit (not shown for simplicity) to write local pre-compare mask words to and/or read local pre-compare mask words from rows of pre-compare CAM array 1212 selected by address decoder 120 via MWL. Further, although shown in the exemplary embodiment of FIG. 12 as receiving CAM words from DBUS, for other embodiments first function generator 161 may receive CAM words from another bus or circuit.

Figure 13:
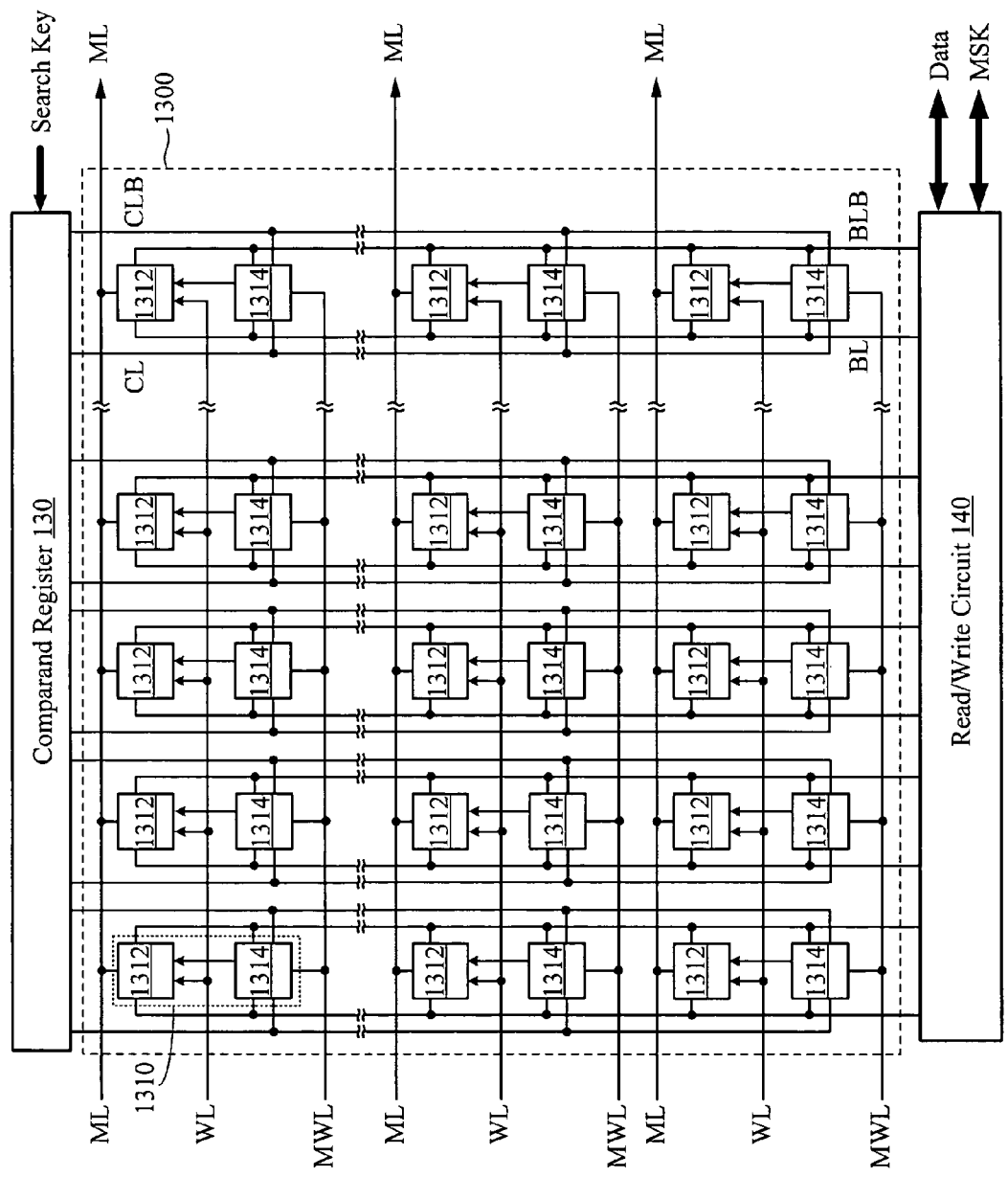
FIG. 13 is a block diagram of one embodiment of the main ternary CAM array of FIG. 12.

FIG. 13 shows a ternary CAM array 1300 that is one embodiment of main CAM array 1216 of FIG. 12. Ternary CAM array 1300 includes a plurality of ternary CAM cells 1310 organized in any number of rows and columns. Each ternary CAM cell 1310, which can be any well-known SRAM-based, DRAM-based, or non-volatile ternary CAM cell, includes a data cell 1312 for storing a data bit and a mask cell 1314 for storing a local mask bit. The data cells 1312 in each row are coupled to a corresponding match line ML and to a corresponding word line WL, and the data cells 1312 in each column are coupled to a corresponding bit line pair BL/BLB. The mask cells 1314 in each row are coupled to a corresponding mask word line MWL, and the mask cells 1314 in each column are coupled to a corresponding bit line pair BL/BLB and to a corresponding comparand line pair CL/CLB. The comparand lines provide a search key for comparison with the CAM words stored in rows of CAM cells 1312 via corresponding mask cells 1314, each of which selectively masks a corresponding bit of the search key in response to the mask bit stored therein. Each word line WL is driven by address decoder 120 to select a row of data cells 1312 for writing or reading. Similarly, each mask word line MWL is driven by address decoder 120 to select a row of mask cells 1314 for writing or reading. Further, although not shown for simplicity, each row of CAM array 1300 may also include one or more validity bits.

Figure 14:
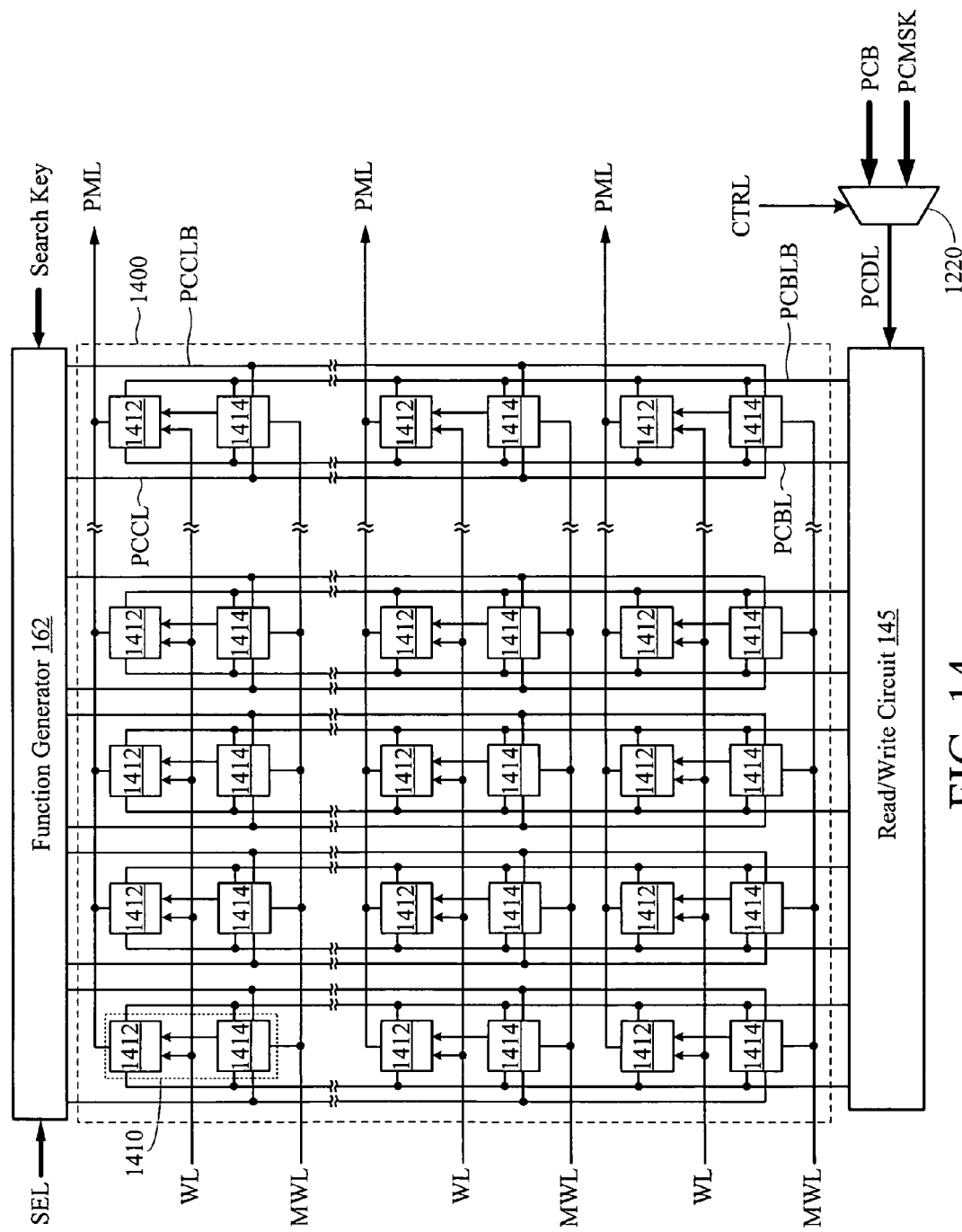
FIG. 14 is a block diagram of one embodiment of the pre-compare ternary CAM array of FIG. 12.

FIG. 14 shows a CAM array 1400 that is one embodiment of pre-compare CAM array 1212 of FIG. 12. Array 1400 includes a plurality of CAM cells 1410 organized in any number of rows and columns. Thus, although shown in FIG. 14 as including multiple columns of CAM cells, for some embodiments, pre-compare CAM array 1400 may include a single column of CAM cells (e.g., for embodiments in which a single pre-compare bit is generated in response to a corresponding CAM word). Each ternary CAM cell 1410, which can be any well-known SRAM-based, DRAM-based, or non-volatile ternary CAM cell, includes a data cell 1412 for storing a pre-compare bit and a mask cell 1414 for storing a local pre-compare mask bit. Further, although not shown in FIG. 12, for some embodiments, each row of pre-compare array 1400 may include one or more validity bits.

The architecture and operation of pre-compare CAM array 1400 is similar to that of main CAM array 1300 of FIG. 13, except that columns of CAM cells 1410 in pre-compare CAM array 1400 are coupled to read/write circuit 145 via one or more corresponding pre-compare bit line pairs PCBL/PCBLB, and are coupled to second function generator 162 via one or more corresponding pre-compare comparand line pairs PCCL/PCCLB. During write operations, first function generator 161 generates a set of pre-compare bits by performing a logical function on a corresponding CAM word, and writes the set of pre-compare bits to a row of data cells 1412 selected by address decoder 120 via WL. Referring also to FIG. 12, mask function generator 1120 generates a pre-compare local mask word PCMSK by performing a selected logical function on a corresponding main local mask word MSK (e.g., in a manner similar to that described above with respect to FIGS. 10 and 11), and provides PCMSK to read/write circuit 145 via MUX 1220. Read/write circuit 145 writes PCMSK to a row of mask cells 1414 selected by address decoder 120 via MWL.

During pre-compare operations, second function generator 162 generates an encoded search key (ESK) in response to a logical operation on the search key, and drives ESK into CAM array 1400 via PCCL/PCCLB for comparison with the sets of pre-compare bits as masked by corresponding pre-compare mask words PCMSK. For the exemplary embodiment of FIG. 14, each pre-compare match line PML provides the pre-compare match results of a pre-compare operation between the encoded search key and a corresponding set of masked pre-compare bits to match line control logic 114 (see also FIG. 12), which in response thereto selectively pre-charges corresponding match lines in the main CAM array in a manner similar to that described above.

For some embodiments, CAM cells 1310 of FIG. 13 and CAM cells 1410 of FIG. 14 may be identical, although for other embodiments CAM cells 1310 and CAM cells 1410 may be of different architectures. For one embodiment, CAM cells 1310 and/or CAM cells 1410 may be implemented using either of the well-known ternary CAM cell architectures 1700A and 1700B shown in FIGS. 17A and 17B, respectively. Ternary CAM cell architectures 1700A and 1700B each include a first storage element 1702 to store a data bit of a CAM word and a second storage element 1704 to store a corresponding bit of the local mask word. The operations of ternary CAM cell architectures 1700A and 1700B are well-known, and therefore are not described in detail herein. For other embodiments, CAM cells 1310 and/or CAM cells 1410 may be implemented using other suitable CAM cell architectures, for example, as described below with respect to FIGS. 18 and 19.

For alternate embodiments, other ternary CAM array architectures may be used for main CAM array 1300 and for pre-compare CAM array 1400. For example, in some embodiments, CAM arrays 1300 and 1400 may not include complementary comparand lines, in which case the complementary bit lines may be used to perform a compare operation as is generally known in the art. Further, although described above in the context of NOR-based CAM arrays, for other embodiments CAM arrays 1300 and 1400 may be NAND-based CAM arrays. In addition, for some embodiments, corresponding rows of pre-compare CAM array 1400 and main CAM array 1300 share the same word line and the same mask word line. For other embodiments, pre-compare CAM array 1400 and main CAM array 1300 may have separate word lines and mask word lines. Further, for other embodiments, main CAM array 1300 and/or pre-compare CAM array 1400 may have separate data bit lines and mask bit lines.

Figure 15:
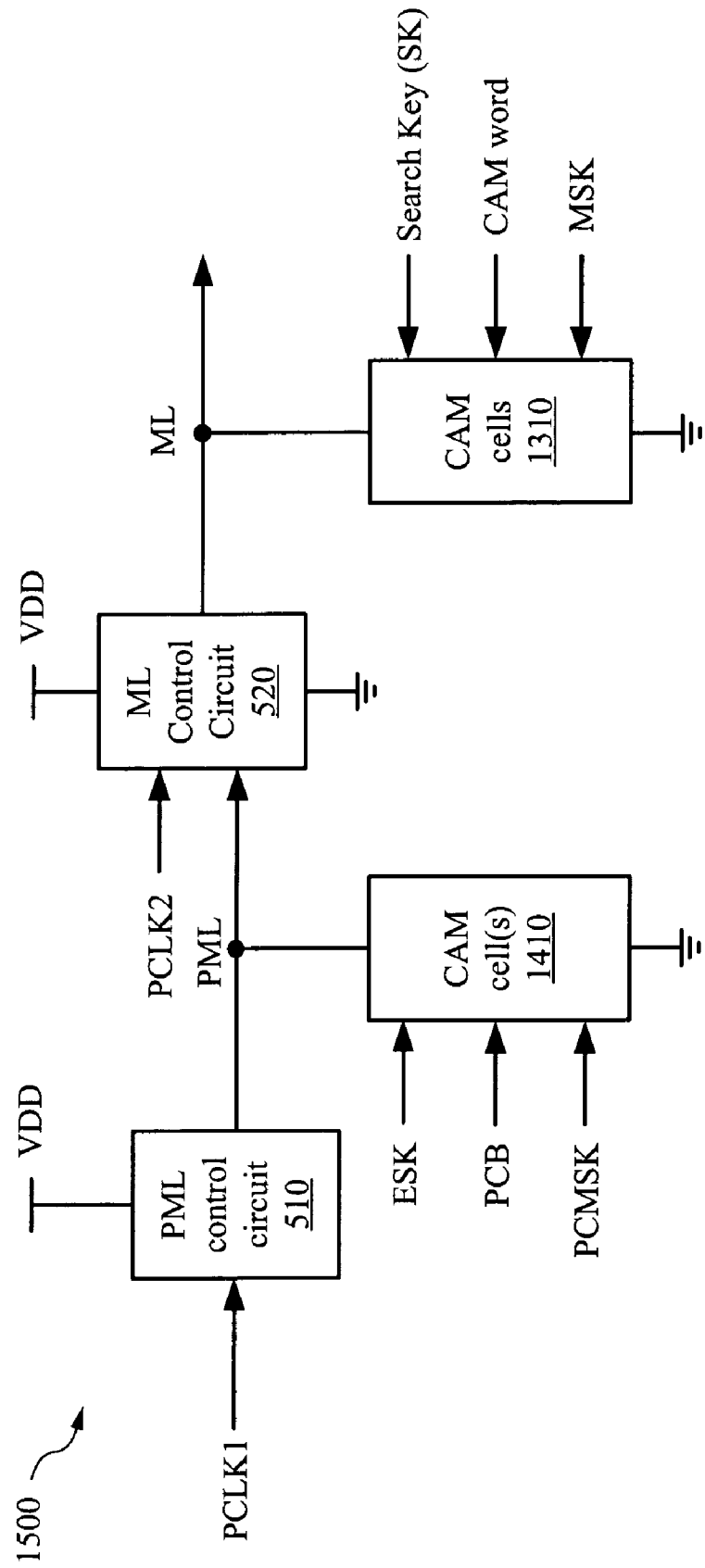
FIG. 15 is a simplified block diagram of one embodiment of a row of the CAM array of FIG. 12.

FIG. 15 is a block diagram of a row 1500 that is one embodiment of the rows in CAM array 1210 of FIG. 12. Row 1500 is shown to include pre-compare match line (PML) control circuit 510, match line (ML) control circuit 520, one or more pre-compare ternary CAM cells 1410, and a plurality of main ternary CAM cells 1310. For simplicity, the pre-compare CAM cells 1410, which form a row in pre-compare CAM array 1212, and the plurality of main CAM cells 1310, which form a row in main CAM array 1216, are represented collectively in FIG. 15. Further, although not shown for simplicity, pre-compare CAM cells 1410 and main CAM cells 1310 are each coupled to a corresponding word line and to a corresponding mask word line that may be selected in a well-known manner by address circuit 120 (see also FIG. 12).

PML control circuit 510 includes an input to receive PCLK1, and an output coupled to the pre-compare match line PML. Pre-compare CAM cells 1410, which are connected between PML and ground potential, include data inputs to receive the pre-compare bits (PCB) and the pre-compare local mask word (PCMSK), and include compare inputs to receive the encoded search key (ESK). ML control circuit 520, which is one embodiment of match line control logic 114 for a corresponding row in the main CAM array, is connected between ML and ground potential, and includes a first input coupled to PML, a second input to receive PCLK2, and an output coupled to ML. Main CAM cells 1310, which are connected between ML and ground potential, include data inputs to receive the CAM words and main local mask words (MSK), and include compare inputs to receive the search key. For other embodiments, PCLK2 may be eliminated.

Figure 6:
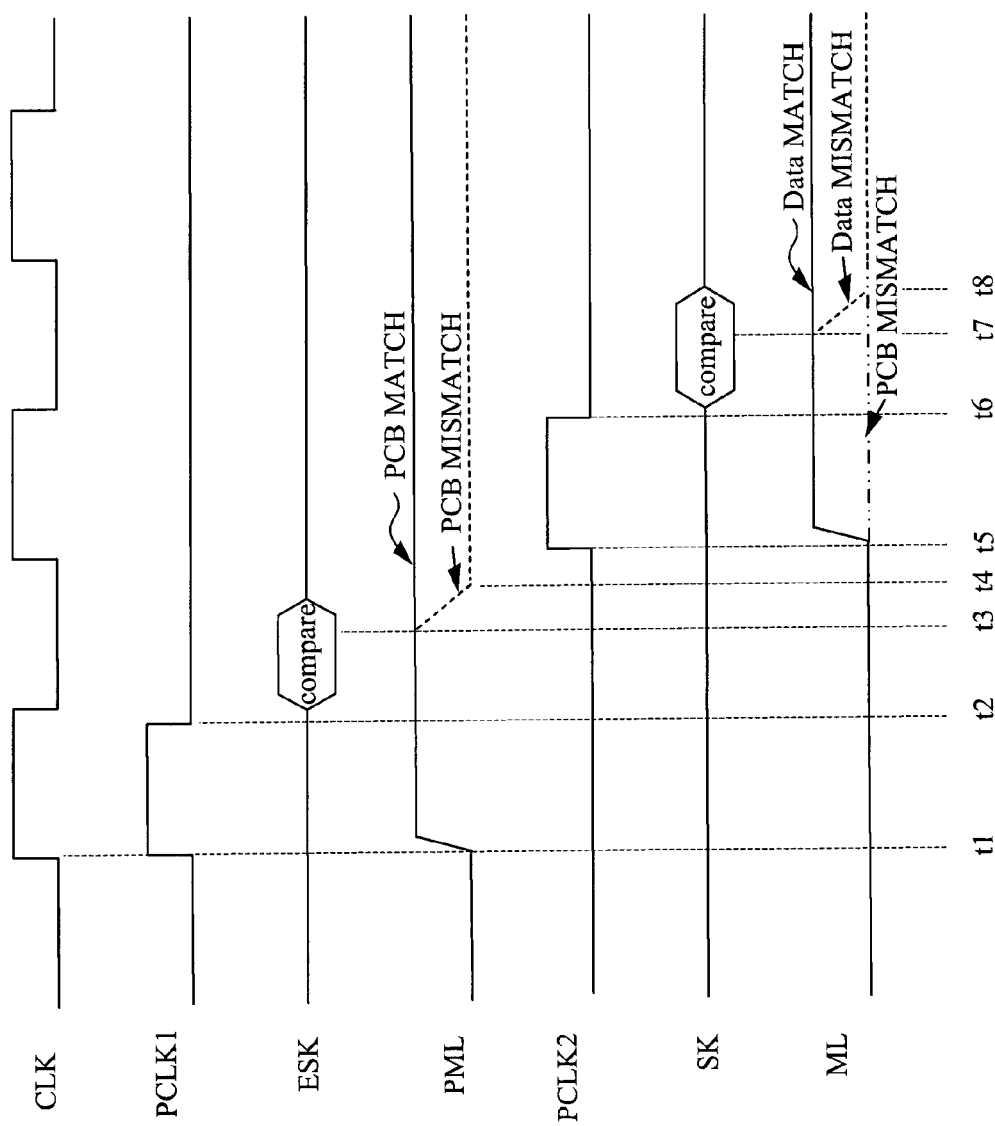
FIG. 6 is an exemplary timing diagram for one embodiment of a compare operation of the CAM device of FIG. 1.

Compare operations for row 1500 of FIG. 15 are similar to that described above with respect to row 500 of FIG. 5 and the timing diagram of FIG. 6, except that the set of pre-compare bits stored in pre-compare CAM cells 1410 are masked by a corresponding local pre-compare mask word during pre-compare operations with the encoded search key, and the CAM word stored in main CAM cells 1310 is masked by a corresponding local mask word during compare operations with the search key. Thus, during pre-compare operations, PML control circuit 510 pre-charges PML (e.g., to logic high), and the encoded search key is compared with the sets of masked pre-compare bits to generate pre-compare match results on PML. Then, for compare operations between the search key and the masked CAM words, ML control circuit 520 selectively pre-charges ML in response to the pre-compare match results. For each main match line ML that is not pre-charged, power consumption is reduced.

Figure 16A:
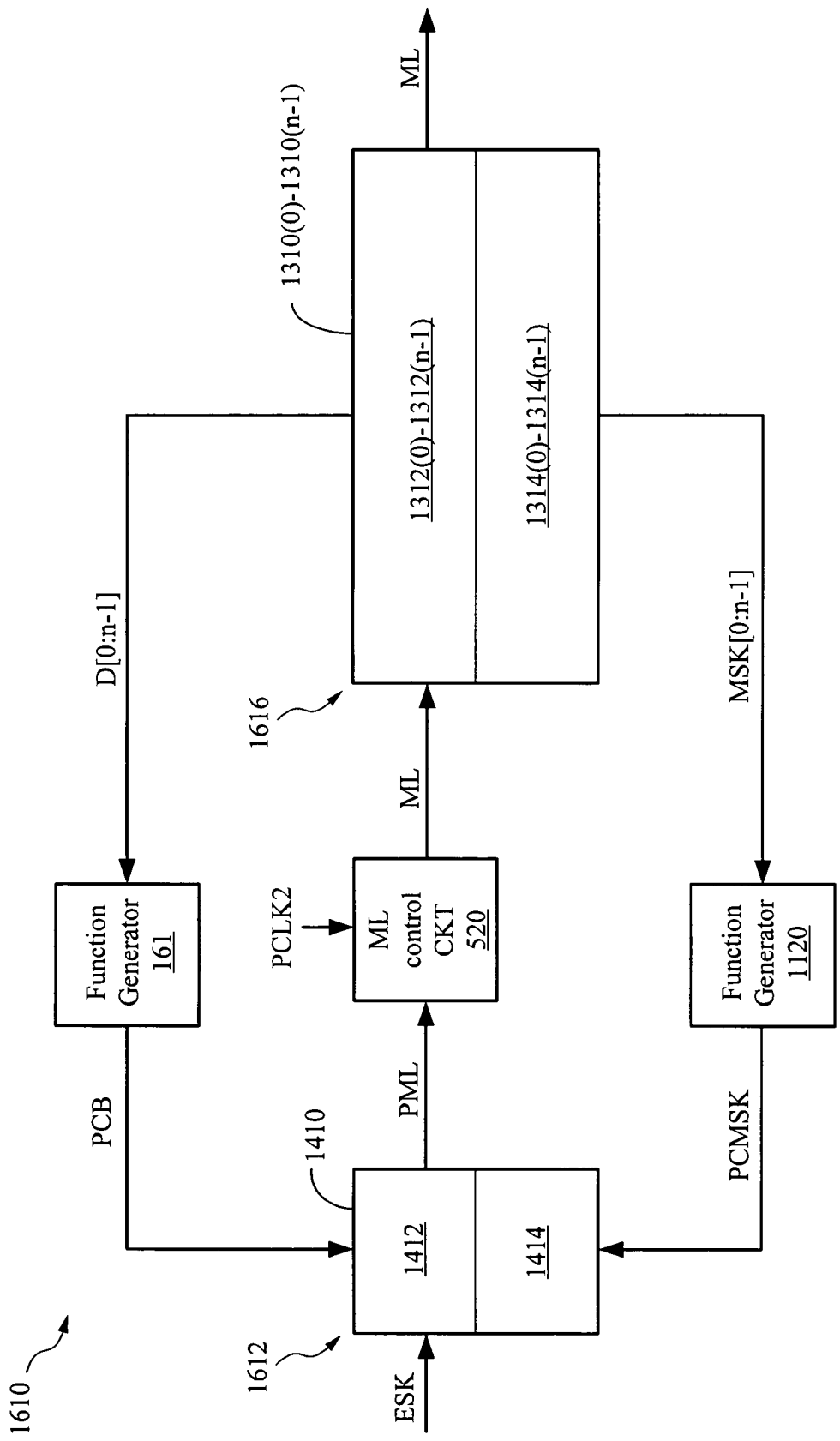
FIG. 16A is a simplified block diagram illustrating generation of pre-compare bits for one embodiment of the row of FIG. 15.

Referring also to FIG. 12, the rows of pre-compare CAM array 1212 of FIG. 12 may include any number of CAM cells to store a corresponding number of pre-compare bits. For some embodiments, all the bits in each CAM word stored in main CAM array 1216 are used by first function generator 161 to generate a single pre-compare bit (PCB). Thus, for such embodiments, each row of pre-compare CAM array 1212 may include a single ternary CAM cell to store a pre-compare bit and a corresponding pre-compare mask bit. For example, FIG. 16A shows a simplified row 1610 that is one embodiment of row 1500 of FIG. 15. Row 1610 is shown to include a row 1612 in pre-compare CAM array 1212 of FIG. 12, a row 1616 in main CAM array 1216 of FIG. 12, and match line control circuit 520. Main CAM row 1616 includes a number n of ternary CAM cells 1310(0)–1310(n−1) to store an n-bit CAM word D[0:n−1] and a corresponding n-bit main local mask MSK[0:n−1], and pre-compare CAM row 1612 includes a single ternary CAM cell 1410 to store one pre-compare bit (PCB) and a corresponding 1-bit pre-compare local mask PCMSK. For clarity, FIG. 16A depicts PCB as being generated in response to D[0:n−1] by first function generator 161, and depicts PCMSK as being generated in response to MSK[0:n−1] by mask function generator 1120. Further, for simplicity, word lines, second function generator 162, individual CAM cells in pre-compare row 1612 and main CAM row 1616, pre-compare match line control circuit 510, and other components of CAM device 1200 described above are not shown in FIG. 16A.

For other embodiments, a number of subsets of each CAM word may be used to generate a corresponding number of pre-compare bits and, similarly, a number of subsets of each local mask word may be used to generate a corresponding number of pre-compare mask word bits. Thus, for such embodiments, the rows of main CAM array 1216 of FIG. 12 may include a number of row segments each for storing a corresponding portion of the CAM word and a corresponding portion of the main local mask word, and the rows of pre-compare CAM array 1212 of FIG. 12 may include a number of row segments each for storing a corresponding pre-compare bit and a corresponding pre-compare local mask word bit. For one embodiment, each pre-compare bit may be generated in response to the pre-determined logical operation on a corresponding portion of an associated CAM word, and each pre-compare local mask bit may be generated in response to the selected (e.g., bit-wise) logical operation on a corresponding portion of an associated main local mask word.

Figure 16B:
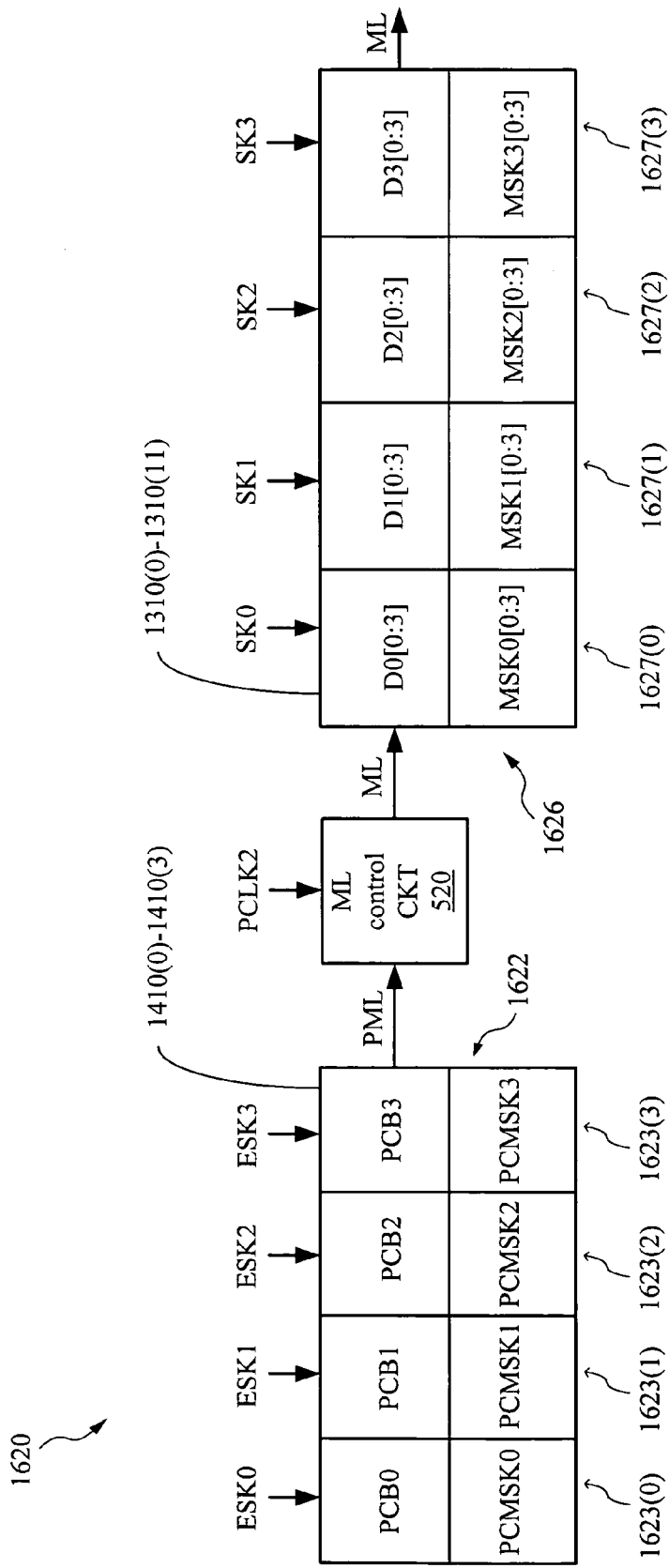
FIG. 16B is a simplified block diagram depicting a segmented embodiment of the row of FIG. 15.

For example, FIG. 16B shows a simplified row 1620 that is another embodiment of row 1500 of FIG. 15. Row 1620 is shown to include a row 1622 in pre-compare CAM array 1212, a row 1626 in main CAM array 1216, and match line control circuit 520. Main CAM row 1626 is shown to include 4 row segments 1627(0)–1627(3), each including subset of ternary CAM cells 1410 to store respective 4-bit portions D0[0:3], D1[0:3], D2[0:3], and D3[0:3] of a CAM word and to store respective 4-bit portions MSK0[0:3], MSK1[0:3], MSK2[0:3], and MSK3[0:3] of a main local mask word. Pre-compare CAM row 1622 is shown to include four segments 1623(0)–1623(3), each including a ternary CAM cell 1410 for storing a corresponding pre-compare bit (PCB) and a corresponding pre-compare local mask bit (PCMSK). Although shown in FIG. 16B as including four row segments 1627(0)–1627(3), for actual embodiments, main CAM row 1626 may include any number of row segments 1627, and each row segment 1627 may include any number of CAM cells 1310. Similarly, pre-compare CAM row 1622 may include any number of corresponding CAM cells 1410. For simplicity, word lines, function generators, individual CAM cells, pre-compare match line control circuit 510, and other components of CAM device 1200 described above are not shown in FIG. 16B.

For first embodiments of FIG. 16B, each pre-compare bit (PCB) stored in pre-compare CAM row 1622 may be generated by performing a predetermined logical function on the CAM word portion D[0:3] stored in a corresponding row segment 1627 of main CAM row 1626, and each pre-compare mask bit (PCMSK) stored in pre-compare CAM row 1622 may be generated by performing a selected logical function on the local mask word portion MSK[0:3] stored in a corresponding row segment 1627 of main CAM row 1626. Generation of the pre-compare bits for these first embodiments of row 1620 may be expressed as PCB0=$f_1${D0[0:3]}, PCB1=$f_1${D1[0:3]}, PCB2=$f_1${D2[0:3]}, and PCB3=$f_1${D3[0:3]}, where $f_1$ is the predetermined logical function performed by function generator 161 of CAM device 1200. Similarly, generation of the pre-compare mask bits for these first embodiments of row 1620 may be expressed as PCMSK0=$f_m${MSK0[0:3]}, PCMSK1=$f_m${MSK1[0:3]}, PCMSK2=$f_m${MSK2[0:3]}, and PCMSK3=$f_m${MSK3[0:3]}, where $f_m$ is the logical function performed by mask function generator 1120 of CAM device 1200. For these first embodiments of FIG. 16B, the number of CAM cells in pre-compare CAM row 1622 is equal to the number of row segments 1627 in main CAM row 1626, and thus the number of pre-compare bits and the number of pre-compare mask bits are equal to the number of CAM word portions.

For second embodiments of FIG. 16B, each pre-compare bit stored in pre-compare CAM row 1622 may be generated by performing a predetermined logical function on similarly positioned bits of the CAM word portions stored in main row segments 1627(0)–1627(3). Generation of the pre-compare bits for these second embodiments of row 1620 may be expressed as PCB0=$f_1${D0[0], D1[0], D2[0], D3[0]}, PCB1=$f_1${D0[1], D1[1], D2[1], D3[1]}, PCB2=$f_1${D0[2], D1[2], D2[2], D3[2]}, and PCB3=$f_1${D0[3], D1[3], D2[3], D3[3]}. Similarly, generation of the pre-compare mask bits for these second embodiments of row 1620 may be expressed as PCMSK0=$f_m${MSK0[0], MSK1[0], MSK2[0], MSK3[0]}, PCMSK1=$f_m${MSK0[1], MSK1[1], MSK2[1], MSK3[1]}, PCMSK2=$f_m${MSK0[2], MSK1[2], MSK2[2], MSK3[2]}, and PCMSK3=$f_m${MSK0[3], MSK1[3], MSK2[3], MSK3[3]}. For these second embodiments of FIG. 16B, the number of CAM cells in pre-compare CAM row 1622 is equal to the number of CAM cells within each row segment 1627 of main CAM row 1626, and thus the number of pre-compare bits and pre-compare mask bits is equal to the number of bits in each CAM word portion.

Figure 17A:
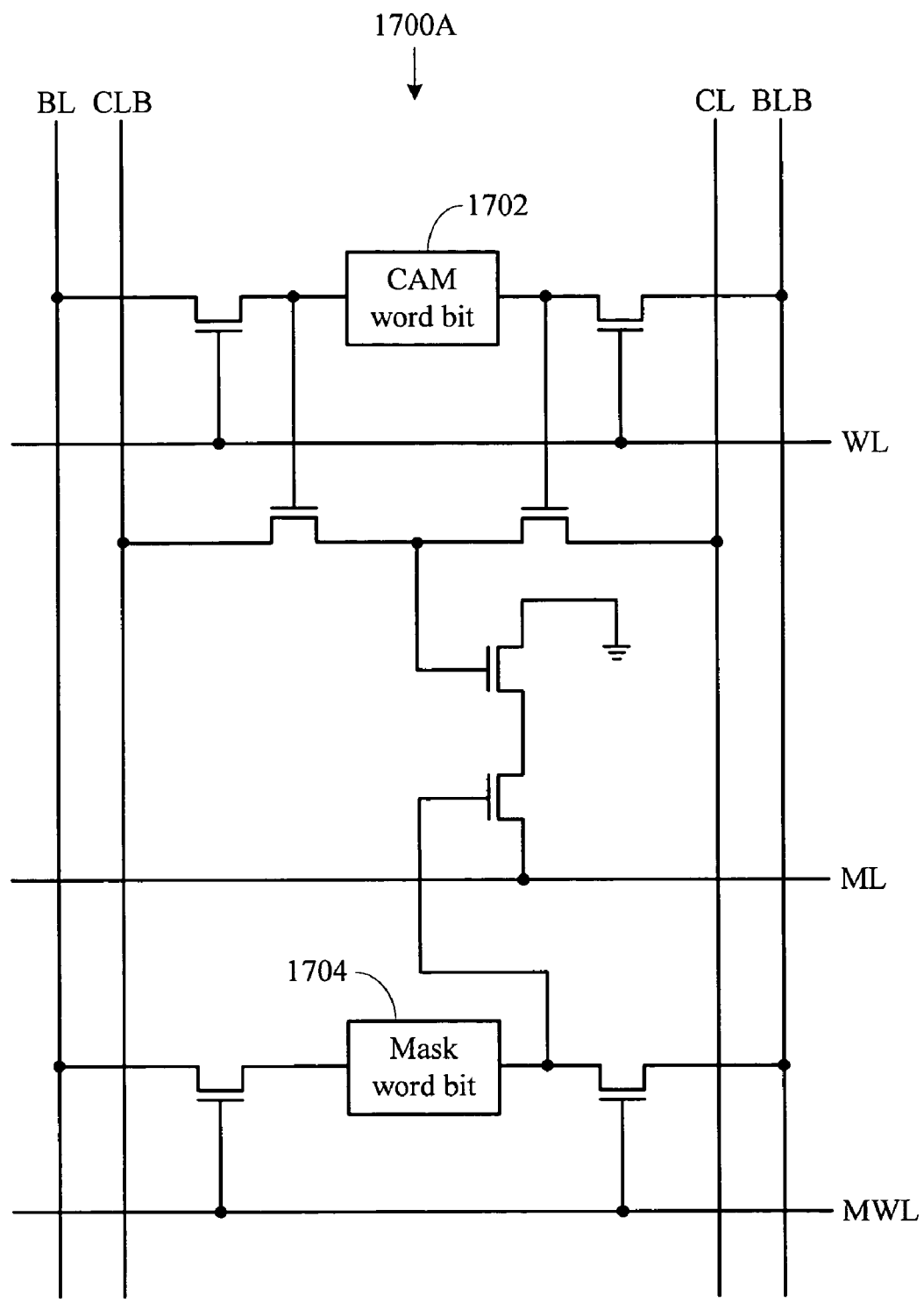
FIGS. 17A and 17B are circuit diagrams of two exemplary embodiments of ternary CAM cell architectures that may be utilized in the CAM device of FIG. 12.
Figure 17B:
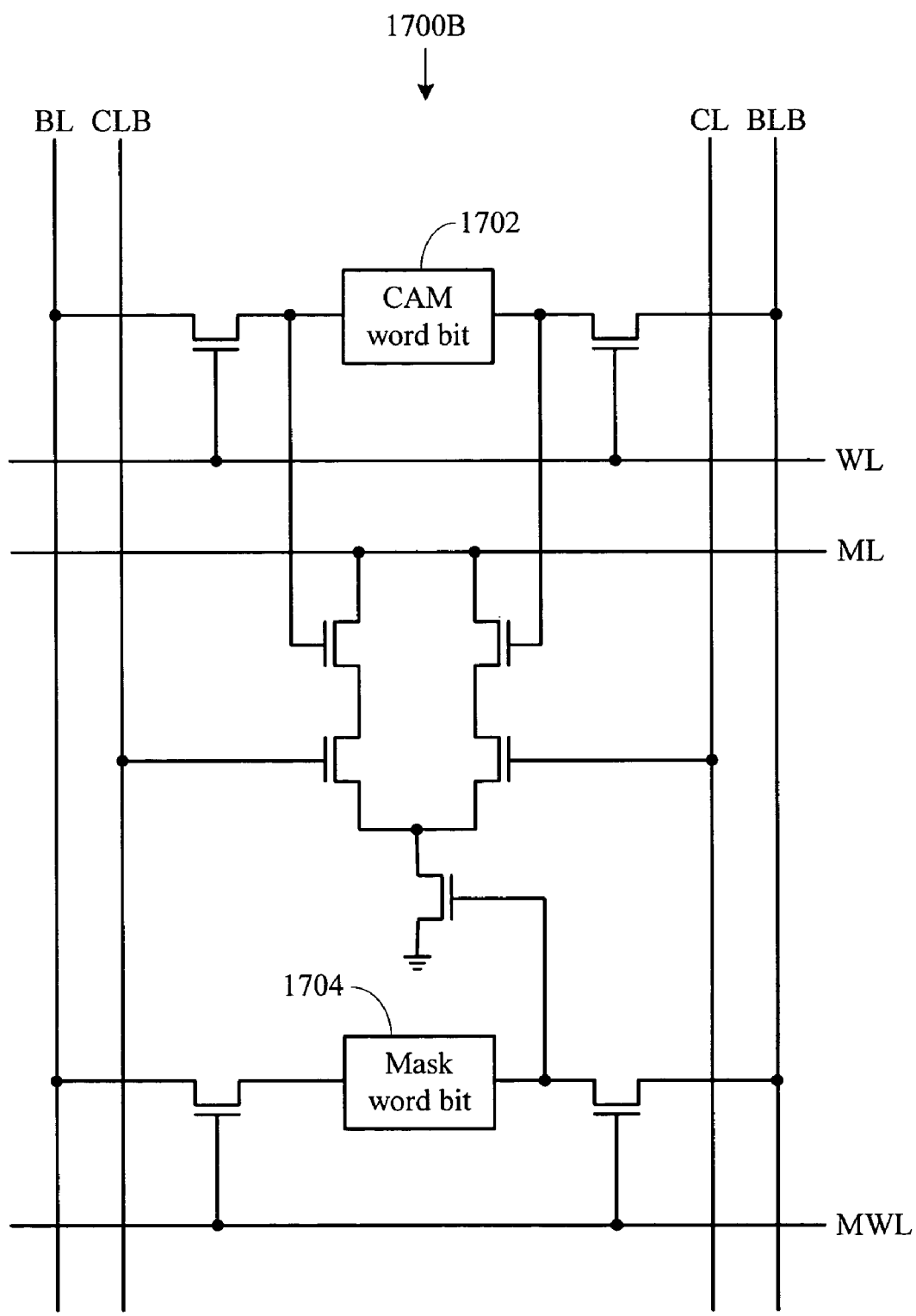

The ternary embodiments described above with respect to FIG. 12 utilize well-known CAM cell architectures (e.g., such as CAM cells 1310 of FIG. 13 and CAM cells 1410 of FIG. 14) having a first storage element 1702 to store a data bit and a second storage element 1704 to store a corresponding local mask bit for masking the data bit, for example, as shown in the exemplary ternary CAM cell architectures of FIGS. 17A and 17B. However, other embodiments of the present invention may be configured to utilize the well-known ternary CAM cell architecture 1800 of FIG. 18, which includes two storage elements 1802X and 1802Y to store "x" and "y" bits, respectively. Together, the "x" and "y" bits represent a selectively masked data value. For example, if a data value stored in CAM cell 1800 is to be masked during compare operations, the "x" and "y" bits are both driven to the same logic state (e.g., to logic low) so that CAM cell 1800 indicates a match condition regardless of the data value stored therein. Conversely, if the data value is not to be masked during compare operations, the "x" and "y" bits are driven to complementary logic states to enable the generation of match results during a compare operation. Thus, a bit of a CAM word and its corresponding local mask bit are "encoded" to generate the "x" and "y" bits stored in CAM cell 1800 in a well-known manner. Because the operation of ternary CAM cell 1800 and the generation of the "x" and "y" bits are well-known, a more described description thereof is omitted for brevity.

Figure 18:
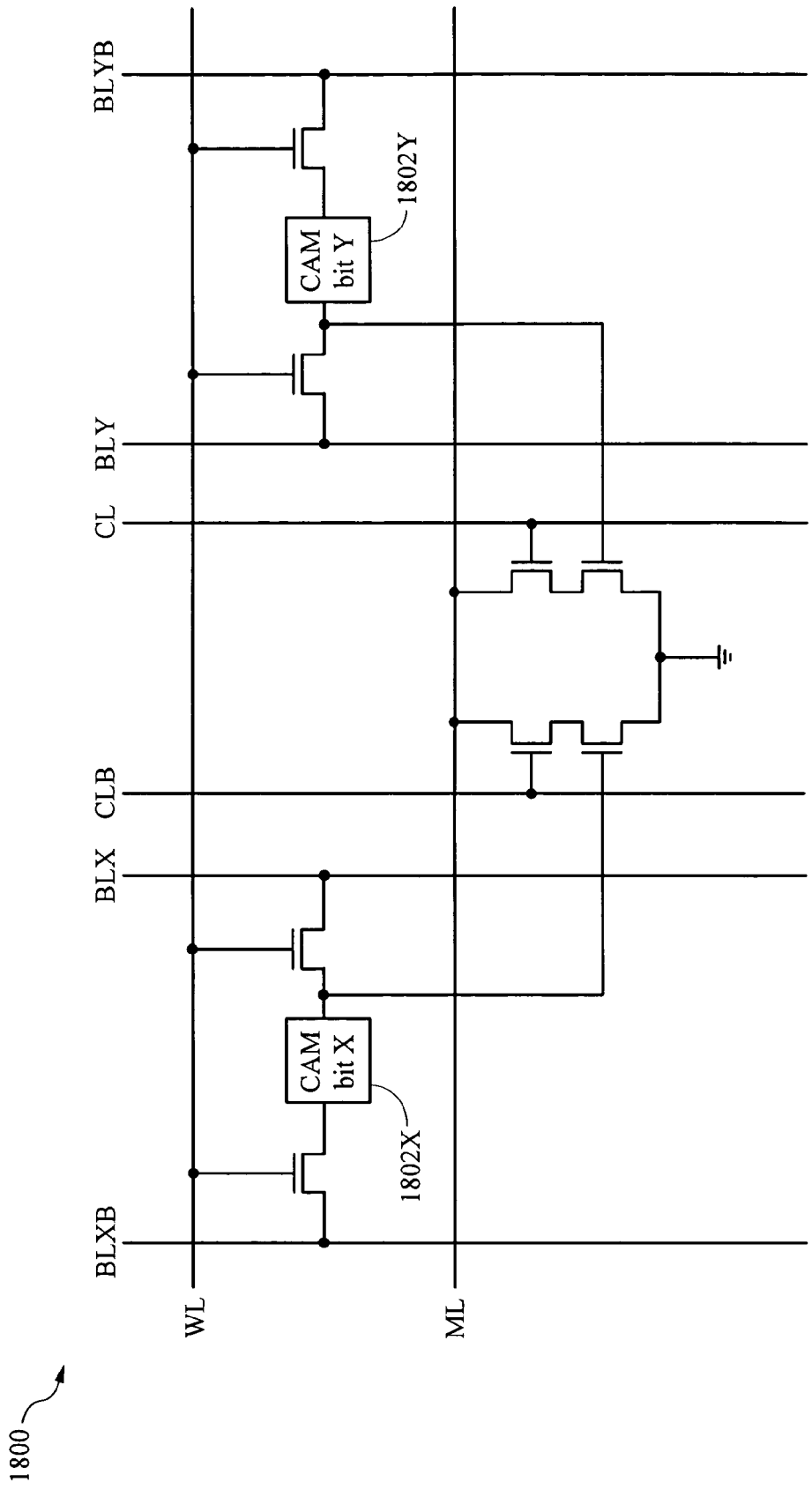
FIG. 18 is a circuit diagram of another embodiment of a ternary CAM cell architecture that may be utilized in some present embodiments.
Figure 19:
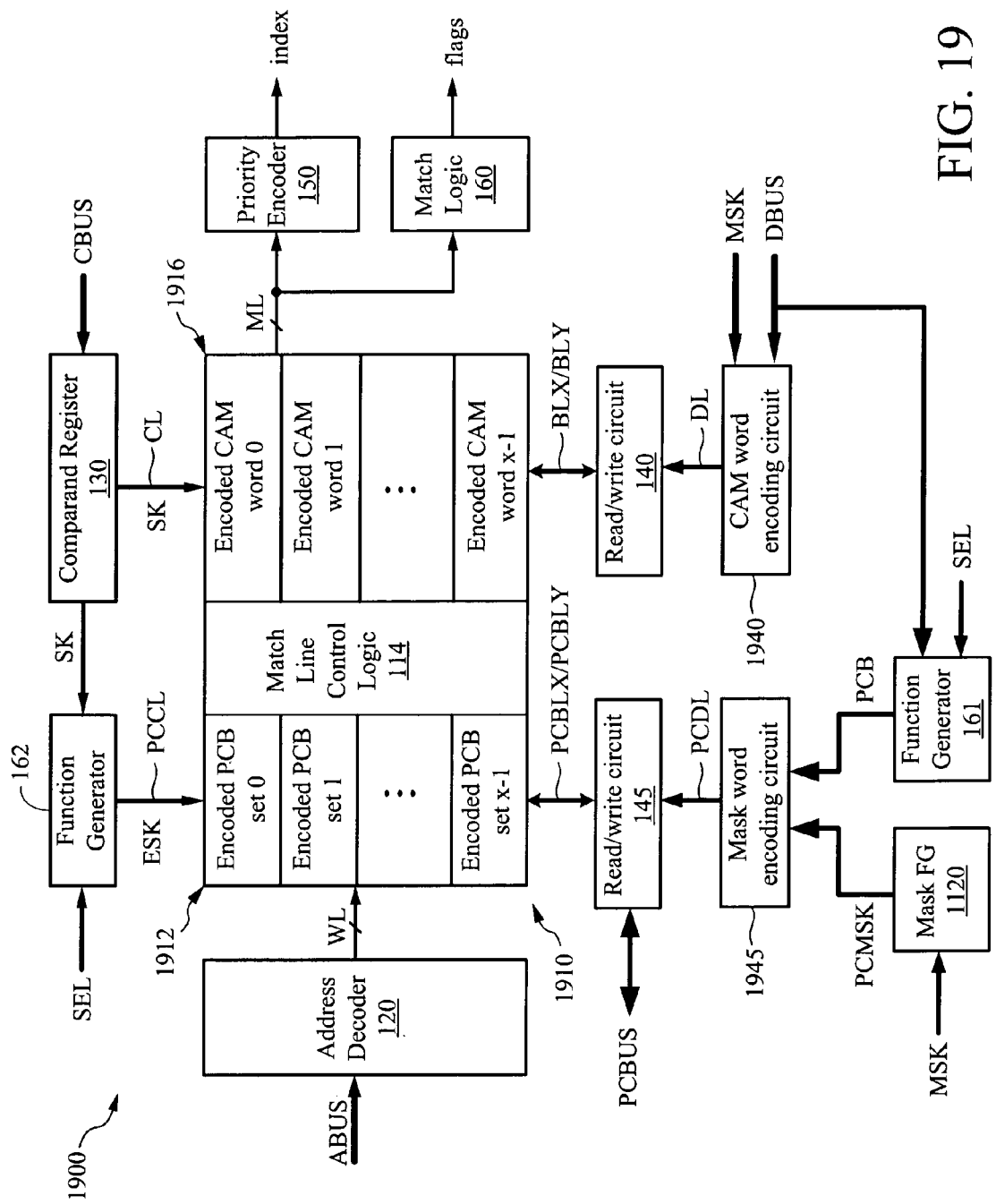
FIG. 19 is a block diagram of another embodiment of the CAM device of FIG. 1 configured to utilize the ternary CAM cells of FIG. 18.

FIG. 19 shows a ternary CAM device 1900 configured to utilize CAM cells 1800 of FIG. 18. CAM device 1900, which is another embodiment of CAM device 100 of FIG. 1, operates in a manner similar to that of CAM device 1200 of FIG. 12, except that its CAM array 1910, which includes a pre-compare CAM array 1912 coupled to a main CAM array 1916 via match line control logic 114, utilizes CAM cells 1800 of FIG. 18. Match line control logic 114 selectively pre-charges the match lines in main CAM array 1916 in response to pre-compare match results in pre-compare CAM array 1912 in a manner similar to that described above with respect to CAM array 1200 of FIG. 12.

Each row in main CAM array 1916 stores a CAM word encoded to selectively mask any number of bit comparisons with the search key, and each row in pre-compare CAM array 1912 stores a pre-compare bit set encoded to selectively mask any number of bit comparisons with the encoded search key. The encoded CAM words and the encoded pre-compare bit sets are coupled to address decoder 120 via corresponding word lines WL, which are represented collectively in FIG. 19. For other embodiments, corresponding rows in pre-compare CAM array 1912 and in main CAM array 1916 may be coupled to address decoder 120 via separate word lines. Further, although not shown in FIG. 19 for simplicity, each row in main CAM array 1916 and/or in pre-compare CAM array 1912 may include any number of validity bits. Other well-known components of CAM device 1900 such as clock and enable signals, instruction decoders, and so on are not shown for simplicity.

For the ternary embodiment of FIG. 19, read/write circuit 140 is coupled to main CAM array 1916 via complementary pairs of "x" and "y" bit lines BLX/BLY (see also FIG. 18), and is coupled a CAM word encoding circuit 1940 via data lines DL. For simplicity, BLX/BLY and DL are represented collectively in FIG. 19. Encoding circuit 1940, which includes a first input to receive a CAM word via DBUS and a second input to receive a main local mask word MSK, is configured to generate the "x" and "y" bits of an encoded CAM word to be stored in a row of main CAM array 1916 in response to corresponding bits of MSK and the original CAM word provided via DBUS. For one embodiment, if a bit of MSK is asserted, encoding circuit 1940 drives the corresponding "x" and "y" bit pair of the encoded CAM word to logic low to prevent its comparison with a corresponding search key bit from affecting match results on ML. However, if the bit of MSK is de-asserted, encoding circuit 1940 drives the corresponding "x" and "y" bit pair of the encoded CAM word to complementary states to allow its comparison with the corresponding search key bit to affect match results on ML. For example, if the original CAM bit is logic high, then encoding circuit 1940 may drive the corresponding "x" bit to logic high and drive the corresponding "y" bit to logic low. Conversely, if the original CAM bit is logic low, then encoding circuit 1940 may drive the corresponding "x" bit to logic low and drive the corresponding "y" bit to logic high.

Although not shown in FIG. 19, for other embodiments, read/write circuit 140 may be coupled to a bus (e.g., to DBUS) to output encoded CAM words read from main CAM array 1916.

Read/write circuit 145 is coupled to pre-compare CAM array 1912 via complementary pairs of "x" and "y" pre-compare bit lines PCBLX/PCBLY (see also FIG. 18), and is coupled a mask word encoding circuit 1945 via pre-compare data lines PCDL. For simplicity, PCBLX/PCBLY and PCDL are represented collectively in FIG. 19. Encoding circuit 1945, which includes a first input to receive a pre-compare bit (PCB) set from first function generator 161 and a second input to receive a pre-compare mask word PCMSK from mask function generator 1120, is configured to generate the "x" and "y" bits of an encoded pre-compare bit set to be stored in a row of pre-compare CAM array 1912 in response to corresponding bits of PCMSK and PCB. For one embodiment, if a bit of PCMSK is asserted, encoding circuit 1945 drives the corresponding "x" and "y" bit pair of the encoded PCB set to logic low to prevent its comparison with a corresponding bit of the encoded search key from affecting pre-compare match results provided to match line control logic 114. However, if the bit of PCMSK is de-asserted, encoding circuit 1945 drives the corresponding "x" and "y" bit pair of the encoded PCB set to complementary states to allow its comparison with the corresponding bit of the encoded search key to affect the pre-compare match results. For example, if the original pre-compare bit provided by mask function generator 1120, is logic high, then encoding circuit 1945 may drive the corresponding "x" bit to logic high and drive the corresponding "y" bit to logic low. Conversely, if the original pre-compare bit is logic low, then encoding circuit 1945 may drive the corresponding "x" bit to logic low and drive the corresponding "y" bit to logic high.

Encoding circuits 1940 and 1945, which are similarly configured to generate the "x" and "y" bit pairs of the encoded CAM word and the encoded PCB set, respectively, may be implemented in a well-known manner, and therefore are not described in further detail herein. For other embodiments, encoding circuits 1940 and 1945 may be the same circuit having outputs multiplexed to main CAM array 1916 and pre-compare. CAM array 1912, first inputs multiplexed to receive the original CAM word (e.g., from DBUS) or the original PCB set (e.g., from first function generator 161), and second inputs multiplexed to receive MSK or PCMSK.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A system, comprising:
 a content addressable memory (CAM) device for comparing a search key with a plurality of CAM words, comprising:
  a main CAM array having a plurality of rows of CAM cells, each row for storing a CAM word and coupled to a corresponding main match line;
  a pre-compare CAM array having a plurality of rows, each row including one or more CAM cells for storing a set of one or more pre-compare bits, and each row coupled to a corresponding pre-compare match line; and
  match line control logic having a plurality of inputs coupled to corresponding pre-compare match lines and having a plurality of outputs coupled to corresponding main match lines; and
 a first function generator having an input to receive the CAM words and having an output to generate corresponding sets of pre-compare bits.

2. The system of claim 1, wherein the CAM device comprises the first function generator.

3. The system of claim 1, wherein the first function generator comprises an error-checking circuit.

4. The system of claim 1, wherein the sets of pre-compare bits are not subsets of corresponding CAM words.

5. The system of claim 1, wherein the first function generator generates each set of pre-compare bits by performing a predetermined logical function on a corresponding CAM word.

6. The system of claim 5, wherein the first function generator selects one of a plurality of predetermined logical functions to perform on the CAM word in response to a select signal.

7. The system of claim 5, wherein each CAM word comprises a plurality of portions each including a number of bits of the CAM word, and the first function generator is configured to perform the predetermined logical function on each CAM word portion to generate a corresponding pre-compare bit.

8. The system of claim 5, wherein each CAM word comprises a plurality of portions each including a number of bits of the CAM word, and the first function generator is configured to perform the predetermined logical function on similarly positioned bits of each CAM word portion to generate a corresponding pre-compare bit.

9. The system of claim 1, wherein the pre-compare bits comprise parity bits generated from corresponding CAM words.

10. The system of claim 1, wherein the match line control logic is configured to selectively pre-charge each main match line in response to a pre-compare operation between an encoded search key and a corresponding set of pre-compare bits.

11. The system of claim 10, further comprising:
 a second function generator having an input to receive the search key and having an output to generate the encoded search key.

12. The system of claim 11, wherein the encoded search key is not a subset of the search key.

13. The system of claim 11, wherein the second function generator generates the encoded search key by performing a predetermined logical function on the search key.

14. The system of claim 13, wherein the second function generator selects one of a plurality of predetermined logical functions to perform on the search key in response to a select signal.

15. The system of claim 11, wherein the first and second function generators comprise an error-checking circuit.

16. The system of claim 10, wherein the match line control logic pre-charges each main match line if there is a match condition indicated on the corresponding pre-compare match line.

17. The system of claim 1, wherein the match line control logic comprises a plurality of main match line control circuits, each having a first input coupled to a corresponding pre-compare match line, and having an output coupled to a corresponding main match line.

18. The system of claim 1, further comprising:
 a main mask circuit coupled to the main CAM array and configured to store a main global mask word;
 a pre-compare mask circuit coupled to the pre-compare CAM array and configured to store a pre-compare global mask word; and
 a mask function generator having an input to receive the main global mask word and having an output to generate the pre-compare global mask word.

19. The system of claim 18, wherein the mask function generator generates the pre-compare global mask word by performing a bit-wise logical operation on the main global mask word such that each bit in the pre-compare global mask word is asserted if any bits in a corresponding portion of the main global mask word are asserted.

20. The system of claim 1, wherein each row of the pre-compare CAM array further comprises a first local mask to store a corresponding pre-compare local mask word, and each row of the main CAM array further comprises a second local mask to store a corresponding main local mask word.

21. The system of claim 20, further comprising:
 a mask function generator having an input to receive the main local mask words and having an output to generate corresponding pre-compare local mask words.

22. The system of claim 21, wherein the mask function generator generates each pre-compare local mask word by performing a bit-wise logical operation on the corresponding main local mask word such that each bit in the pre-compare local mask word is asserted if any bits in a corresponding portion of the main local mask word are asserted.

23. A content addressable memory (CAM) device for comparing a search key with a plurality of CAM words, comprising:
 a main CAM array having a plurality of rows of CAM cells, each row for storing a CAM word and coupled to a corresponding main match line;
 a pre-compare CAM array having a plurality of rows of CAM cells, each row for storing a set of one or more pre-compare bits and coupled to a corresponding pre-compare match line, wherein each set of pre-compare bits comprises a predetermined logical function of a corresponding CAM word; and
 match line control logic having a plurality of inputs coupled to corresponding pre-compare match lines and having a plurality of outputs coupled to corresponding main match lines.

24. The CAM device of claim 23, wherein the pre-compare bits comprise parity bits for corresponding CAM words.

25. The CAM device of claim 23, further comprising:
 a first function generator having an input to receive the CAM words, and having an output to generate corresponding sets of pre-compare bits.

26. The CAM device of claim 25, wherein the first function generator selects one of a plurality of predetermined logical functions to perform on the CAM words in response to a select signal.

27. CAM device of claim 25, further comprising:
a second function generator having an input to receive the search key, and having an output to generate an encoded search key.

28. The CAM device of claim 27, wherein the encoded search key is generated by performing the predetermined logical function on the search key.

29. The CAM device of claim 27, wherein the encoded search key is compared with the sets of pre-compare bits to generate pre-compare match results on corresponding pre-compare match lines.

30. The CAM device of claim 29, wherein the match line control logic selectively enables each main match line for the comparing in response to a corresponding pre-compare match result.

31. The CAM device of claim 27, wherein the encoded search key is not a subset of the search key, and the sets of pre-compare bits are not subsets of corresponding CAM words.

32. The CAM device of claim 27, wherein the first and second function generators comprise an error-checking circuit.

33. The CAM device of claim 23, further comprising:
a main mask circuit coupled to the main CAM array and configured to store a main global mask word;
a pre-compare mask circuit coupled to the pre-compare CAM array and configured to store a pre-compare global mask word; and
a mask function generator having an input to receive the main global mask word and having an output to generate the pre-compare global mask word.

34. The CAM device of claim 33, wherein the mask function generator generates the pre-compare global mask word by performing a bit-wise logical operation on the main global mask word such that each bit in the pre-compare global mask word is asserted if any bits in a corresponding portion of the main global mask word are asserted.

35. The CAM device of claim 23, wherein each row of the pre-compare CAM array further comprises a first local mask to store a corresponding pre-compare local mask word, and each row of the main CAM array further comprises a second local mask to store a corresponding main local mask word.

36. The CAM device of claim 35, further comprising:
a mask function generator having an input to receive the main local mask words and having an output to generate corresponding pre-compare local mask words.

37. The CAM device of claim 36, wherein the mask function generator generates each pre-compare local mask word by performing a bit-wise logical operation on the corresponding main local mask word such that each bit in the pre-compare local mask word is asserted if any bits in a corresponding portion of the main local mask word are asserted.

38. A content addressable memory (CAM) device for comparing a search key with a plurality of CAM words, comprising:
means for generating a set of one or more pre-compare bits for each CAM word by performing a predetermined logical function on the CAM word;
means for generating an encoded search key by performing the predetermined logical function on the search key;
means for comparing the encoded search key to the sets of pre-compare bits in a pre-compare operation to generate corresponding pre-compare match signals; and
means for selectively enabling a compare operation between the search key and each CAM word in response to corresponding pre-compare match signals.

39. The CAM device of claim 38, wherein the pre-compare bits comprise parity bits for corresponding CAM words.

40. The CAM device of claim 38, wherein the sets of pre-compare bits are not subsets of corresponding CAM words, and the encoded search key is not a subset of the search key.

41. The CAM device of claim 38, wherein the means for generating comprises a function generator configurable to select one of a plurality of predetermined logical functions in response to a select signal.

42. The CAM device of claim 38, wherein the means for selectively enabling pre-charges a match line for a CAM word if there is a match condition indicated by a corresponding pre-compare match signal and discharges the match line if there is a mismatch condition indicated by the corresponding pre-compare match signal.

43. The CAM device of claim 38, further comprising:
means for masking the CAM words with a main global mask word during the compare operation;
means for masking the pre-compare bits with a pre-compare global mask word during the pre-compare operation; and
means for generating the pre-compare global mask word in response to the main global mask word.

44. The CAM device of claim 43, wherein the pre-compare global mask word is generated by performing a selected logical function on the main global mask word.

45. The CAM device of claim 44, wherein a logic high mask bit masks a corresponding bit comparison, and the selected logical function comprises a bit-wise logical OR operation.

46. The CAM device of claim 44, wherein a logic low mask bit masks a corresponding bit comparison, and the selected logical function comprises a bit-wise logical AND operation.

47. The CAM device of claim 43, wherein the pre-compare global mask word is not a subset of the main global mask word.

48. The CAM device of claim 38, further comprising:
means for masking each CAM word with a corresponding main local mask word during the compare operation;
means for masking each set of pre-compare bits with a corresponding pre-compare local mask word during the pre-compare operation; and
means for generating the pre-compare local mask words in response to corresponding main local mask words.

49. The CAM device of claim 48, wherein each pre-compare local mask word is generated by performing a selected logical function on a corresponding main local mask word.

50. The CAM device of claim 49, wherein a logic high mask bit masks a corresponding bit comparison, and the selected logical function comprises a bit-wise logical OR operation.

51. The CAM device of claim 49, wherein a logic high mask bit masks a corresponding bit comparison, and the selected logical function comprises a bit-wise logical AND operation.

52. The CAM device of claim 48, wherein the pre-compare local mask words are not subsets of corresponding main local mask words.

53. A method of controlling match lines in an array of a content addressable memory (CAM) device during a compare operation between a search key and a plurality of CAM words stored in the array, comprising:
generating a set of one or more pre-compare bits for each CAM word, wherein the sets of pre-compare bits are not subsets of corresponding CAM words;
generating an encoded search key in response to the search key;
comparing the encoded search key with the sets of pre-compare bits; and
selectively enabling the match lines for the compare operation in response to the comparing.

54. The method of claim 53, wherein the pre-compare bits comprise parity bits for corresponding CAM words.

55. The method of claim 53, wherein generating the set of pre-compare bits comprises:
performing a predetermined logical function on a corresponding CAM word.

56. The method of claim 55, wherein generating the encoded search key comprises:
performing the predetermined logical function on the search key.

57. The method of claim 56, wherein the predetermined logical function is not a unity function.

58. The method of claim 53, wherein the selectively enabling comprises:
pre-charging each match line if there is a match between the encoded search key and a corresponding set of pre-compare bits.

59. The method of claim 58, wherein the selectively enabling further comprises:
discharging the match line if there is a mismatch between the encoded search key and the corresponding set of pre-compare bits.

60. The method of claim 53, further comprising:
providing a plurality of main local mask words each for masking a corresponding CAM word; and
generating a plurality of pre-compare local mask words in response to corresponding main local mask words, each pre-compare local mask word for masking a corresponding set of pre-compare bits.

61. The method of claim 60, wherein generating the pre-compare local mask word comprises:
performing a bit-wise logical function on the corresponding main local mask word.

62. The method of claim 53, further comprising:
providing a main global mask word for masking the CAM words during the compare operation with the search key; and
generating a pre-compare global mask word in response to the main global mask word, the pre-compare global mask word for masking the sets of pre-compare bits during the comparing with the encoded search key.

63. The method of claim 62, wherein generating the pre-compare global mask word comprises:
performing a bit-wise logical function on the main global mask word.

64. A method of controlling match lines in an array in a content addressable memory (CAM) device during a compare operation between a search key and CAM words stored in the array, comprising:
performing a logical function on each CAM word to generate a corresponding set of one or more pre-compare bits;
performing the logical function on the search key to generate an encoded search key;
comparing the encoded search key with the sets of pre-compare bits; and
selectively enabling the match lines for the compare operation in response to the comparing.

65. The method of claim 64, wherein the pre-compare bits comprise parity bits for corresponding CAM words.

66. The method of claim 64, wherein the sets of pre-compare bits are not subsets of corresponding CAM words, and the encoded search key is not a subset of the search key.

67. The method of claim 64, wherein the selectively enabling comprises:
pre-charging each match line if there is a match between the encoded search key and a corresponding set of pre-compare bits.

68. The method of claim 67, wherein the selectively enabling further comprises:
discharging the match line if there is a mismatch between the encoded search key and the corresponding set of pre-compare bits.

69. The method of claim 64, further comprising:
masking each set of pre-compare bits with a corresponding pre-compare local mask word during the comparing with the encoded search key; and
masking each CAM word with a corresponding main local mask word during the compare operation with the search key.

70. The method of claim 69, wherein each bit of the pre-compare local mask word is asserted if any bit in a corresponding portion of the main local mask word is asserted.

71. The method of claim 64, further comprising:
masking the sets of pre-compare bits with a pre-compare global mask word during the comparing with the encoded search key; and
masking the CAM words with a main global mask word during the compare operation with the search key.

72. The method of claim 71, wherein each bit of the pre-compare global mask word is asserted if any bit in a corresponding portion of the main global mask word is asserted.

* * * * *